United States Patent
Shamouilian et al.

(10) Patent No.: US 6,557,248 B1
(45) Date of Patent: May 6, 2003

(54) METHOD OF FABRICATING AN ELECTROSTATIC CHUCK

(75) Inventors: Shamouil Shamouilian, San Jose, CA (US); Manoocher Birang, Los Gatos, CA (US); John F. Cameron, Los Altos, CA (US); Chandra Deshpandey, Fremont, CA (US); Alfred Goldspeil, Watsonville, CA (US); Ron Northrup, San Jose, CA (US); Semyon Sherstinsky, San Francisco, CA (US); Sasson Someth, Los Altos Hills, CA (US)

(73) Assignee: Applied Materials Inc., Santa Clara, CA (US)

( * ) Notice: Subject to any disclaimer, the term of this patent is extended or adjusted under 35 U.S.C. 154(b) by 980 days.

(21) Appl. No.: 09/087,332

(22) Filed: May 29, 1998

Related U.S. Application Data

(60) Division of application No. 08/410,449, filed on Mar. 24, 1995, now Pat. No. 5,822,171, which is a continuation-in-part of application No. 08/278,787, filed on Jul. 19, 1994, now abandoned, which is a continuation-in-part of application No. 08/199,916, filed on Feb. 22, 1994, now abandoned.

(51) Int. Cl.$^7$ ............................................... H01R 43/00
(52) U.S. Cl. ................................. 29/825; 361/234
(58) Field of Search ..................... 29/825, 829, 830; 361/234

(56) References Cited

U.S. PATENT DOCUMENTS

| | | |
|---|---|---|
| 3,983,401 A | 9/1976 | Livesay |
| 3,993,509 A | 11/1976 | McGinty |
| 4,184,188 A | 1/1980 | Briglia |
| 4,384,918 A | 5/1983 | Abe |
| 4,399,016 A | 8/1983 | Tsukada et al. |
| 4,520,421 A | 5/1985 | Sakitani et al. |
| 4,667,110 A | 5/1987 | Kariya |

(List continued on next page.)

FOREIGN PATENT DOCUMENTS

| | | | |
|---|---|---|---|
| DE | 3633386 | * | 10/1988 |
| EP | 467623 A2 | * | 1/1992 |
| EP | 0512936 | * | 4/1992 |
| EP | 0552877 | * | 1/1993 |
| EP | 644578 A1 | * | 3/1995 |
| JP | 60261377 | * | 12/1985 |
| JP | 62286249 | * | 12/1987 |
| JP | 6372877 | * | 4/1988 |
| JP | 63131536 | * | 6/1988 |
| JP | 63283037 | * | 11/1988 |
| JP | 1-298721 | * | 12/1989 |
| JP | 1-321136 | * | 12/1989 |
| JP | 2-27748 | * | 1/1990 |
| WO | WO9411944 | * | 5/1994 |

OTHER PUBLICATIONS

Klein, Allen J., "Curing Techniques for Composites," *Advanced Composites*, Mar./Apr. 1988, pp. 32–44.

"Data Sheet—Breathers and Bleeders," Data Sheet from Airtech International, Inc., Carson, California (1993).

"Kapton General Information," Technical Brochure from DuPont de Nemours Company, Wilmington, Delaware (1993).

(List continued on next page.)

*Primary Examiner*—Richard Chang
(74) *Attorney, Agent, or Firm*—Ashok K. Janah; Joseph Boch

(57) ABSTRACT

A method of fabricating an electrostatic member 33 for holding a substrate 45 in a process chamber 80 containing erosive process gas. The method comprises the steps of forming an electrostatic member 33 comprising an insulator or dielectric layer 35 covering an electrically conductive layer, and shaping the electrostatic member 33 to form a dielectric covered electrode and an electrical connector 55 attached to the dielectric covered electrode 50 to conduct charge to the dielectric covered electrode 50.

9 Claims, 15 Drawing Sheets

U.S. PATENT DOCUMENTS

| | | |
|---|---|---|
| 4,724,510 A | 2/1988 | Wicker et al. |
| 4,771,730 A | 9/1988 | Tezuka |
| 4,968,374 A | 11/1990 | Tsukada et al. |
| 5,049,421 A | 9/1991 | Kosh |
| 5,094,885 A | 3/1992 | Selbrede |
| 5,155,652 A | 10/1992 | Logan et al. |
| 5,160,152 A | 11/1992 | Toraguchi et al. |
| 5,191,506 A | 3/1993 | Logan et al. |
| 5,207,437 A | 5/1993 | Barnes et al. |
| 5,221,403 A | 6/1993 | Nozawa et al. |
| 5,221,450 A | 6/1993 | Hattori et al. |
| 5,238,499 A | 8/1993 | Van De Ven et al. |
| 5,250,137 A | 10/1993 | Arami et al. |
| 5,255,153 A | 10/1993 | Nozawa et al. |
| 5,270,266 A | 12/1993 | Hirano et al. |
| 5,275,683 A | 1/1994 | Arami et al. |
| 5,311,452 A | 5/1994 | Yokota et al. |
| 5,348,497 A | 9/1994 | Nitescu |
| 5,415,728 A | 5/1995 | Hasegawa et al. |
| 5,460,684 A | 10/1995 | Saeki et al. |
| 5,478,429 A | 12/1995 | Komino et al. |
| 5,484,485 A | 1/1996 | Chapman |
| 5,507,874 A | 4/1996 | Su et al. |
| 5,528,451 A | 6/1996 | Su |
| 5,529,657 A | 6/1996 | Ishii |
| 5,631,803 A | 5/1997 | Cameron et al. ............ 361/234 |
| 5,691,876 A | 11/1997 | Chen et al. |
| 5,708,557 A | 1/1998 | Feigenbaum et al. |

OTHER PUBLICATIONS

"R/flex® High Temperature Materials," Data Sheet DS20903D, Rogers Corporation, Chandler, Arizona (1993).

Daviet, J.F., et al., "Electrostatic Clamping Applied to Semiconductor Plasma Processing. 1. Theoretical Modeling," *J. Electrochem. Soc.*, 140(11):3245–3255 (Nov. 1993).

Daviet, J.F., et al., "Electrostatic Clamping Applied to Semiconductor Plasma Process. II. Experimental Results," *J. Electrochem. Soc.*, 140(11):3256–3261 (Nov. 1993).

Steger, R.J., "Heat Transfer in Gas Cooled Pedestals," (Apr. 5, 1991).

Wright, D.R., et al., "Low Temperature Etch Chuck: Modeling and Experimental Results of Heat Transfer and Wafer Temperture," *J. Vac. Sci. Technol.*, 10(4):1065–1070 (Jul./Aug. 1992).

Watanabe, T., et al., "Electrostatic Force and Absorption Current of Alumina Electrostatic Chuck", *Jpn. J. Appl. Phys.*, vol. 31 (1992) Pt. 1, No. 7, (pp. 2145–2150).

Nakasuji, M., et al., "Low Voltage and High Speed Operating Electrostatic Wafer Chuck," *J. Vac. Sci. Technol. A.*, 10(6):3573–3578, Nov./Dec. 1992.

Communication, European Search Report, Application No. EP 95 30 0811.7, dated May 24, 1995.

European Search Report, application No. 95305847, dated Dec. 22, 1995.

European Search Report, application No. 95305850, date Dec. 28, 1995.

European Search Report, application No. 95305850.0, dated Jul. 10, 1996.

"Double–sided Electrostatic Chuck," IBM Technical Disclosure Bulletin, vol. 32, No. 5B, Oct. 1989.

U.S. patent application entitled, "Protective Coating for Dielectric Material on Wafer Support Used on Integrated Circuit Processing Apparatus and Method of Forming Same"; filed Apr. 22, 1993; Ser. No. 08/052,018; Inventors: Wu, et al.; Attorney Docket No. 428.

U.S. patent application entitled, "Erosion Resistant Electrostatic Chuck"; filed Feb. 2, 1994; Ser. No. 08/199,402; Inventors: Shamouilian, et al.; Attorney Docket No. 556 (10516–3).

U.S. patent application entitled, "Electrostatic Chuck with Erosion–Resistant Electrode Connection"; filed Feb. 22, 1994; Ser. No. 08/199,916; Inventors: Shamouilian, et al.; Attorney Docket No. 556–2 (10516–2).

U.S. patent application entitled, "Electrostatic Chuck with Erosion Resistant Electrical Connector"; filed Jul. 19, 1994; Ser. No. 08/278,787; Inventors: Cameron, et al.; Attorney Docket No. 556.P1 (10516).

U.S. patent application entitled, "Barrier Seal for Electrostatic Chuck"; filed May 11, 1995; Ser. No. 08/439, 010; Inventors: Salfelder, et al.; Attorney Docket No. 734.P1 (10699–1).

U.S. patent application entitled, "Method of Protecting Electrostatic Chuck"; filed May 11, 1995; Ser. No. 08/439, 011; Inventors: Salfelder, et al.; Attorney Docket No. 734.P2 (10699–2).

U.S. patent application entitled, "An Electrostatic Chuck Having a Grooved Surface"; filed Jul. 20, 1993; Ser. No. 08/094,640; Inventor: Steger; Attorney Docket No. 260.

\* cited by examiner

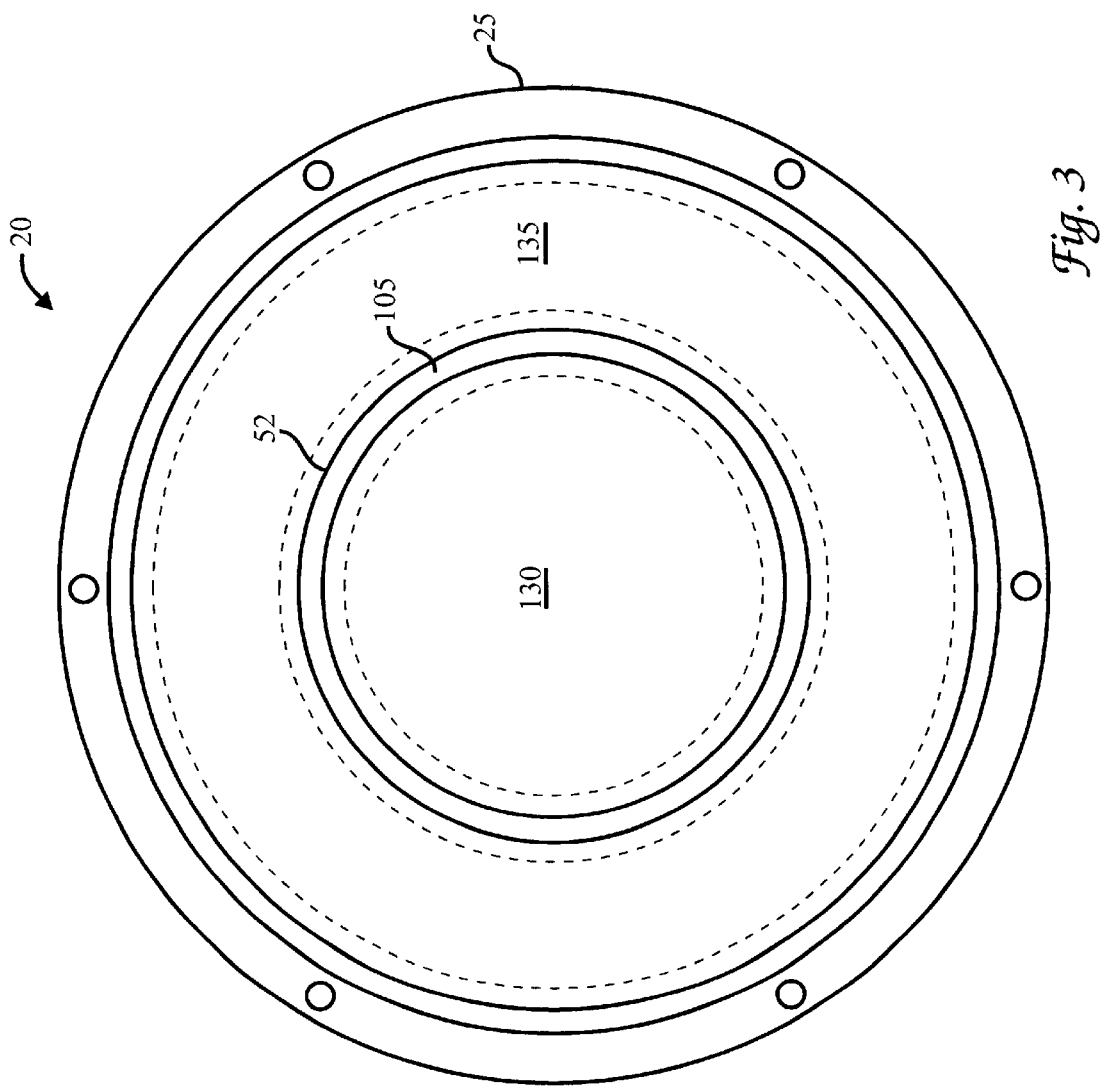

METHOD OF FABRICATING AN ELECTROSTATIC CHUCK

CROSS-REFERENCE

This application is a divisional of U.S. patent application Ser. No. 08/410,449, entitled, "Electrostatic Chuck with Improved Erosion Resistance," filed Mar. 24, 1995, now U.S. Pat. No. 5,822,171 by Shamouilian, et al.; which is continuation-in-part of U.S. patent application Ser. No. 08/278,787, entitled "Electrostatic Chuck with Erosion Resistant Electrical Connector," filed Jul. 19, 1994, by Cameron, et al., now abandoned; which is a continuation-in-part of U.S. patent application Ser. No. 08/199,916 entitled "Electrostatic Chuck with Erosion-Resistant Electrode Connection," filed Feb. 22, 1994, by Shamouilian, et al., now abandoned. This application is related to U.S. patent applications Ser. No. 08/199,402, entitled "Erosion Resistant Electrostatic Chuck," filed Feb. 22, 1994, by Shamouilian, et al., now abandoned; Ser. No. 08/876,549 entitled "Masking Gas System for Improving Erosion Resistance of Electrostatic Chucks" filed Jun. 19, 1997, by Shamouilian, et al.; Ser. No. 09/024,917 entitled "Electrostatic Chuck with Improved Erosion Resistance" filed Feb. 17, 1998, by Shamouilian, et al.; and Ser. No. 08/276,735, entitled "Electrostatic Chuck Having Improved Erosion Resistance," filed Jul. 18, 1994, by Shamouilian, et al., issued on Feb. 25, 1997, U.S. Pat. No. 5,606,485. All of these applications are incorporated herein by reference.

BACKGROUND

This invention relates to electrostatic chucks having improved erosion resistance, for holding substrates in process chambers.

In semiconductor fabrication processes, electrostatic chucks are used to hold a semiconductor substrate, such as a silicon wafer, during processing of the substrate. Electrostatic chucks are generally described in, for example, U.S. patent application Ser. No. 08/189,562, entitled "Electrostatic Chuck" by Shamouilian, et al., filed on Jan. 31, 1994, which is incorporated herein by reference.

Electrostatic chucks can be formed from as little as a single electrostatic member comprising an insulative layer with an electrode embedded therein. However, a typical electrostatic chuck includes a base capable of being secured to a support in a process chamber with the electrostatic member on the base. More typically, the electrostatic member on the chuck has coolant grooves therein for holding a coolant for cooling the substrate to prevent overheating and damage to the substrate during processing. To use the chuck, a substrate is placed on the electrostatic member, and the electrostatic member is electrically biased with respect to the substrate by an electrical voltage. Process gas is introduced into the process chamber for processing the substrate, and in certain processes, a plasma is formed from the process gas. Opposing electrostatic charge accumulates in the electrostatic member and in the substrate, and the resultant attractive electrostatic force electrostatically holds the substrate to the chuck. The electrostatically held substrate covers and seals the coolant grooves on the chuck so that coolant does not leak out from the grooves.

The electrostatic member on the chuck typically comprises an insulator having one or more metallic electrodes embedded therein. An insulated electrical connector strap extends over the edge of the base and connects the electrode of the electrostatic member to a voltage supply source. Typically, the insulator on the electrode and on the connector strap comprises an electrically insulative organic polymer, such as a polyimide. The use of polymers to insulate the electrode and connector strap of the chuck, limits the lifetime of the chuck in certain substrate fabrication processes. Polymers have relatively low erosion resistance for certain process gases and plasmas, and in particular, for oxygen-containing gases and plasmas which are used for a variety of substrate processing operations, including etching of substrates and cleaning of process chambers. When a substrate is held on the chuck, a portion of the polymeric insulator on the chuck is covered by the substrate and protected from the erosive gases in the chamber. However, the insulator at the perimeter of the electrostatic member and on the electrical connector strap portion that extends over the edge of the base of the chuck is exposed to the erosive gas in the process chamber. After numerous processing cycles, the exposed insulator erodes until the electrode or the electrical connector is exposed to the plasma. Exposure of the electrode or connector may occur in as few as a thousand process and cleaning cycles. Exposure at even a single point may cause arcing between the electrode and plasma in the chamber, destroying the usefulness of the chuck and requiring replacement of the entire chuck. Frequent replacement of chucks is expensive and slows down the fabrication process. Also, if the chuck fails during processing of the substrate, the entire substrate can be lost, at a cost of several thousands of dollars.

Although alternative insulative materials, such as silicon oxide based ceramic insulators, can be used to insulate and protect electrostatic members in oxygen-containing processes, these materials have limited effectiveness in other processes. For example, silicon oxide insulators rapidly erode in processes that use fluorine containing gases, such as fluorocarbon gases. Also, ceramic insulators are generally more difficult and expensive to manufacture.

Conventional electrostatic chucks have another disadvantage. A typical electrostatic chuck can have an electrostatic member comprising (i) a single electrode for use as a monopolar electrode, or (ii) two or more electrodes for use as bipolar electrodes. Monopolar electrode chucks can electrostatically hold a substrate only during the plasma stages of the process. Typically, a positive potential is applied to the monopolar electrode on the chuck, and the substrate is maintained at a negative potential by the charged plasma species in the chamber which impinge on the substrate, causing electrostatic charge to accumulate in the substrate and electrically hold the substrate to the chuck. During the non-plasma stages of the process, the substrate is not electrostatically held to the chuck and can move or become misaligned during processing. Also, because the substrate is not clamped to the chuck, the substrate does not seal the coolant grooves on the chuck, preventing holding of coolant in the grooves for cooling the substrate.

Bipolar chucks can electrostatically hold a substrate for both plasma and non-plasma processes because bipolar chucks are operated by applying a positive potential to one of the electrodes and a negative potential to the other electrode. However, when a bipolar chuck is used in a plasma process where charged plasma species impinge on the substrate, a complex circuit is necessary to balance the current flow, and voltage applied to, each electrode. The complex circuit requires a floating power supply that allows the charged plasma species to maintain the substrate either at a negative potential of a few hundred volts or at electrical ground. The complex circuitry renders the chuck more complicated and costly to use.

Use of conventional bipolar electrode chucks is also disadvantageous because bipolar electrodes provide only about ¼ of the electrostatic clamping force provided by a monopolar electrode having the same electrode area. Lower electrostatic force occurs because electrostatic clamping force is proportional to the square of the electrode area, and each bipolar electrode has only half the area of a single monopolar electrode. Maximizing electrostatic clamping force is advantageous because higher clamping force reduces movement or misalignment of the substrate during processing which can result in loss of the entire substrate. Also, the higher clamping force allows more coolant, or coolant at higher pressures, to be held in the cooling grooves without coolant escaping from the grooves, thereby allowing better control of the temperature of the substrate.

Thus, it is desirable to have an electrostatic chuck that is substantially resistant to erosion in corrosive gaseous environments. It is also desirable to have a chuck that can maximize the electrostatic clamping force for holding the substrate to the chuck. It is further desirable to have a chuck that can be used for both non-plasma and plasma processes without use of complex circuitry and that can be inexpensively fabricated using conventional fabrication equipment.

SUMMARY

The present invention is related to a method of fabricating an electrostatic chuck having an erosion resistant electrical connector. The method comprises the steps of forming an electrostatic member comprising a dielectric layer covering an electrically conductive layer, and shaping the electrostatic member to form a dielectric covered electrode and an electrical connector attached to the dielectric covered electrode to conduct charge to the dielectric covered electrode.

In another aspect, the method includes the step of forming a base having a bore therethrough, shaping an electrostatic member comprising a unitary conductive member in an insulator to form an insulated electrode and an attached electrical connector, and placing the electrostatic member on the base and extending the electrical connector through the hole in the base so that a portion of the electrical connector extends below the base.

Preferably, an electrostatic member comprising an insulated electrode and an electrical connector, is shaped by the steps of (i) forming a laminate of a unitary conductive layer on a first dielectric layer, (ii) etching, cutting, routing or milling the electrically conductive layer to form an electrode having grooves and an attached electrical connector, and (iii) applying a second dielectric layer over the electrically conductive layer. The electrostatic member is positioned on the base and the electrical connector is extended through the bore in the base so that a portion of the electrical connector is below the base.

In yet another aspect, the present invention comprises a method of forming an electrostatic member having an integral electrical connector, by the steps of providing a laminate comprising a metal layer between insulative layers, and etching, cutting, routing or milling the metal layer of the laminate to produce a unitary metal layer comprising an electrode portion and an electrical connector portion.

DRAWINGS

These and other features, aspects, and advantages of the present invention will become better understood with regard to the following description, appended claims, and accompanying drawings, where:

FIG. 3 is a top plan view of an electrostatic chuck having a double ring electrode configuration with a cooling groove between the electrodes;

FIG. 9 is a partial cross-sectional, side elevational view of the electrostatic chuck and masking gas assembly of FIG. 1a.

DESCRIPTION

Figure 1A:
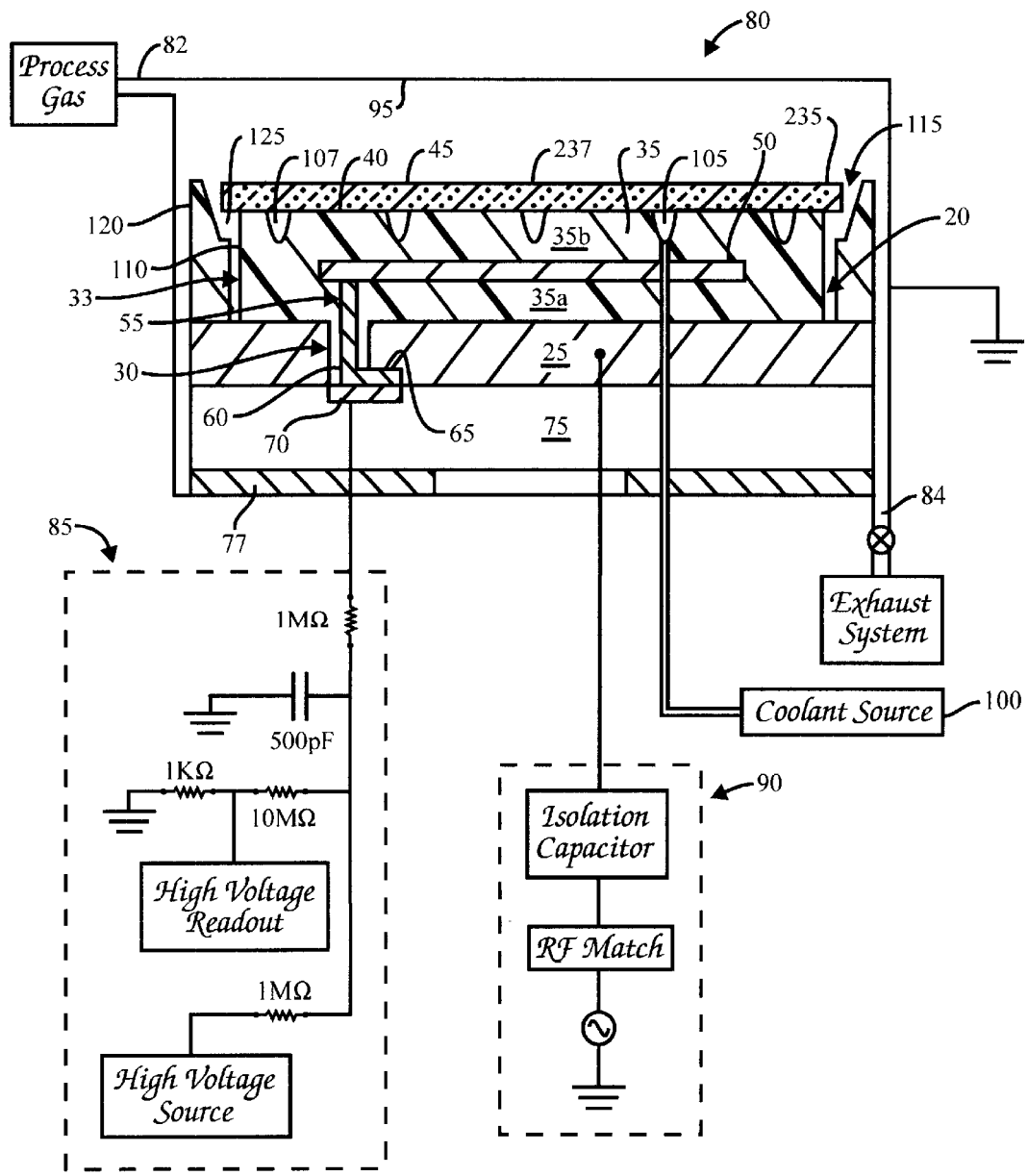
FIG. 1a is a cross-sectional, side elevational schematic view of a process chamber showing operation of an electrostatic chuck having a single electrode and a masking gas assembly around the chuck.

With reference to FIG. 1a, operation of a version of the electrostatic chuck 20 according to the present invention will be described. In this version, the electrostatic chuck 20 comprises a base 25 with a bore 30 therethrough. An electrostatic member 33 having an electrode 50 therein, is supported by the base 25. Typically, the electrostatic member 33 comprises an insulator 35 having (i) a lower insulative layer 35a and an upper insulative layer 35b enclosing the electrode 50, and (ii) an upper surface 40 for receiving a substrate 45 thereon. An electrical connector 55 comprising an electrical lead 60, also known as a voltage supply lead, is electrically connected to the electrode 50. The electrical lead extends through the bore 30 of the base 25 and ends in an electrical contact 65 (or contact assembly 67) which electrically engages a voltage supply terminal 70.

During its use, the electrostatic chuck 20 is secured on a support 75 in a process chamber 80. The process chamber 80 includes an electrically grounded surface 95 which forms an enclosure for plasma processing of substrates 45. The process chamber 80 typically includes a gas inlet 82 for introducing a plasma-forming process gas, and a throttled exhaust 84 for exhausting the reacted plasma and gas products from the process chamber 80. The support 75 in the process chamber 80 has an insulator flange 77 disposed between the support 75 and the grounded surface 95 to electrically isolate the support from the grounded surface 95. The particular embodiment of the process chamber 80 shown in FIG. 1a is suitable for plasma processing of substrates 45, the plasma being a primary source of erosion of the chuck 20. However, the present invention can be used with other process chambers and other processes without deviating from the scope of the invention.

When the chuck 20 is secured on the support 75, the electrical contact 65 of the chuck 20 electrically engages the voltage supply terminal 70 on the support 75. A first voltage supply 85 provides an electrical voltage to the voltage supply terminal 70 on the support 75 for operating the chuck 20. The first voltage supply 85 typically includes a circuit which comprises a high voltage DC source of about 1000 to 3000 volts, connected to a high voltage readout, through a 10 MΩ resistor. A 1 MΩ resistor in the circuit limits current flowing through the circuit, and a 500 pF capacitor is provided as an alternating current filter.

A second voltage supply 90 is connected to the support 75 in the process chamber 80. At least a portion of the support 75 is typically electrically conductive and functions as a process electrode, or cathode, for forming a plasma in the chamber 80. The second voltage supply 90 is provided for electrically biasing the support 75 with respect to the electrically grounded surface 95 in the chamber 80, to form a plasma from process gas introduced into the chamber 80. The second voltage supply 90, as shown in FIG. 1a, generally comprises an RF impedance that matches the impedance of the process chamber 80 to the impedance of the line voltage, in series with an isolation capacitor.

To operate the chuck 20, the process chamber 80 is evacuated and maintained at a predetermined, subatmospheric pressure. A substrate 45 is then placed on the chuck 20, and the electrode 50 of the chuck 20 is electrically biased with respect to the substrate 45 by the first voltage supply 85. Thereafter the process gas is introduced into the chamber 80 via the gas inlet 82, and plasma is formed from the process gas by activating the second voltage supply 90. The voltage applied to the electrode 50 causes electrostatic charge to accumulate in the electrode 50 and the plasma in the chamber 80 provides electrically charged species having opposing polarity which accumulate in the substrate 45. The accumulated opposing electrostatic charge results in an attractive electrostatic force between the substrate 45 and the electrode 50 in the chuck, causing the substrate 45 to be electrostatically held to the chuck 20.

To cool the substrate 45 held on the chuck 20, a coolant source 100 can be used to supply coolant to cooling grooves 105 in the upper surface 40 of the insulator 35. The substrate 45 held on the chuck 20 covers up and seals the grooves 105, preventing coolant from leaking out. The coolant in the grooves 105 removes heat from the substrate 45 and maintains the substrate 45 at constant temperatures during processing of the substrate. Typically, the cooling grooves 105 on the insulator 35 are spaced apart, sized, and distributed so that coolant held in the grooves 105 can cool substantially the entire substrate 45. Typically, the grooves 105 form a pattern of intersecting channels, the channels extending through the entire insulator 35 and electrode 50, as described below. Preferably, the grooves 105 are patterned such that the bore 30 through the base 25 is aligned with one of the grooves 105. Alternative groove patterns are described in aforementioned U.S. patent application Ser. No. 08/189,562.

Figure 1B:
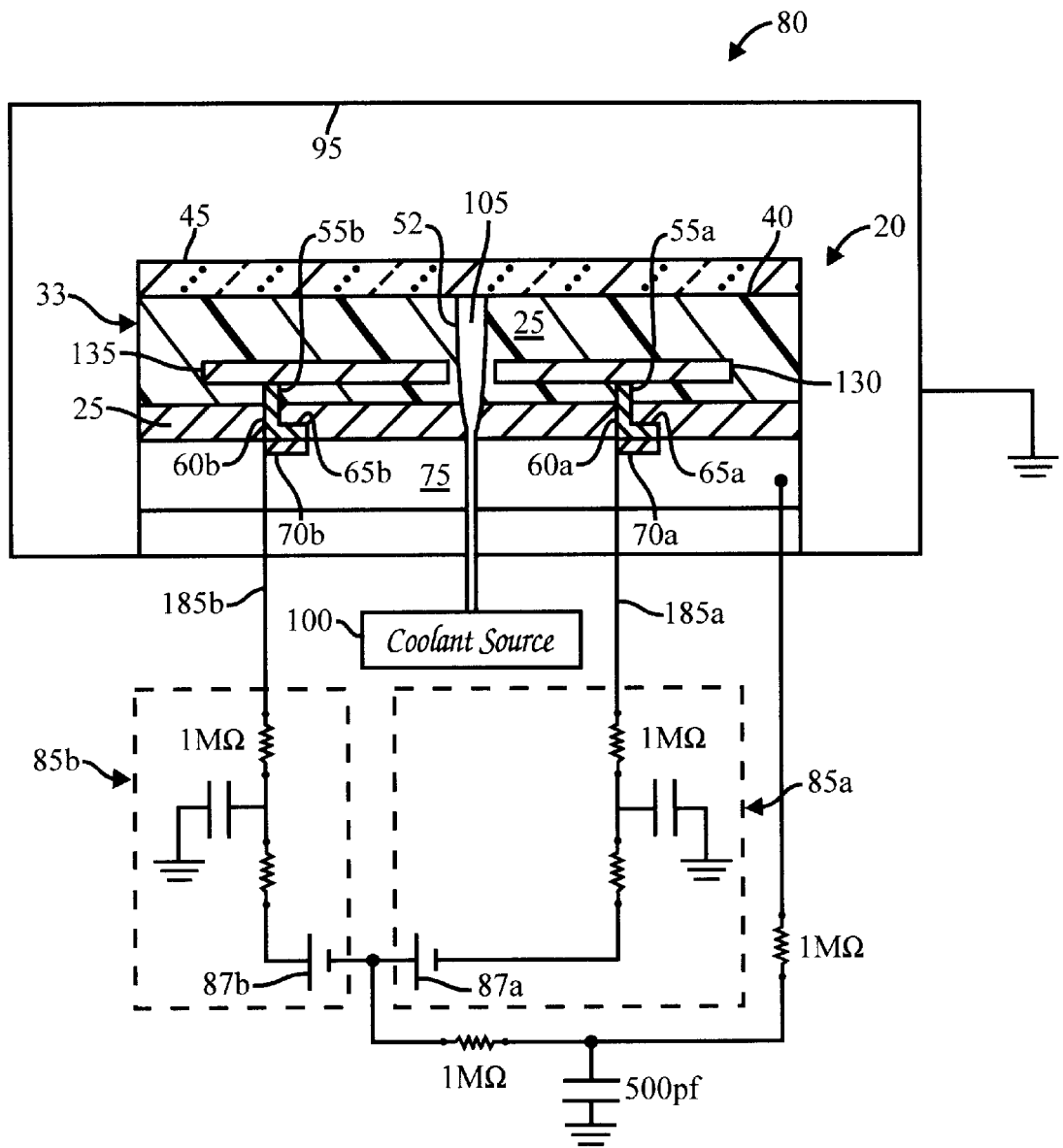
FIG. 1b is a cross-sectional, side elevational schematic view of a process chamber showing operation of a bipolar electrostatic chuck.

With reference to FIG. 1b, operation of a bipolar chuck 20 having an electrostatic member 33 with two electrodes 130, 135 therein, will be described. The first voltage supply 85 powering the bipolar electrodes in the chuck 20 can have several alternative configurations. In a preferred configuration, the first voltage supply 85 comprises (i) a first electrical circuit or voltage source 85a which typically includes a first DC power source 87a, and (ii) a second electrical circuit or voltage source 85b which includes a second DC power source 87b. The first and second power sources 87a, 87b, respectively, provide negative and positive voltages to the first 130 and second 135 electrodes to maintain the electrodes 130, 135 at negative and positive electric potentials relative to the conductive support 75 of the electrostatic chuck 20. The opposing electric potentials of the electrodes 130, 135 induce opposing electrostatic charges in the electrodes 130, 135 and in the substrate 45 held to the chuck 20 without use of a plasma in the process chamber 80, causing the substrate 45 to be electrostatically held to the chuck 20. Bipolar electrode configurations are advantageous for non-plasma processes in which there are no charged plasma species to serve as charge carriers for electrically biasing the substrate.

Figure 2A:
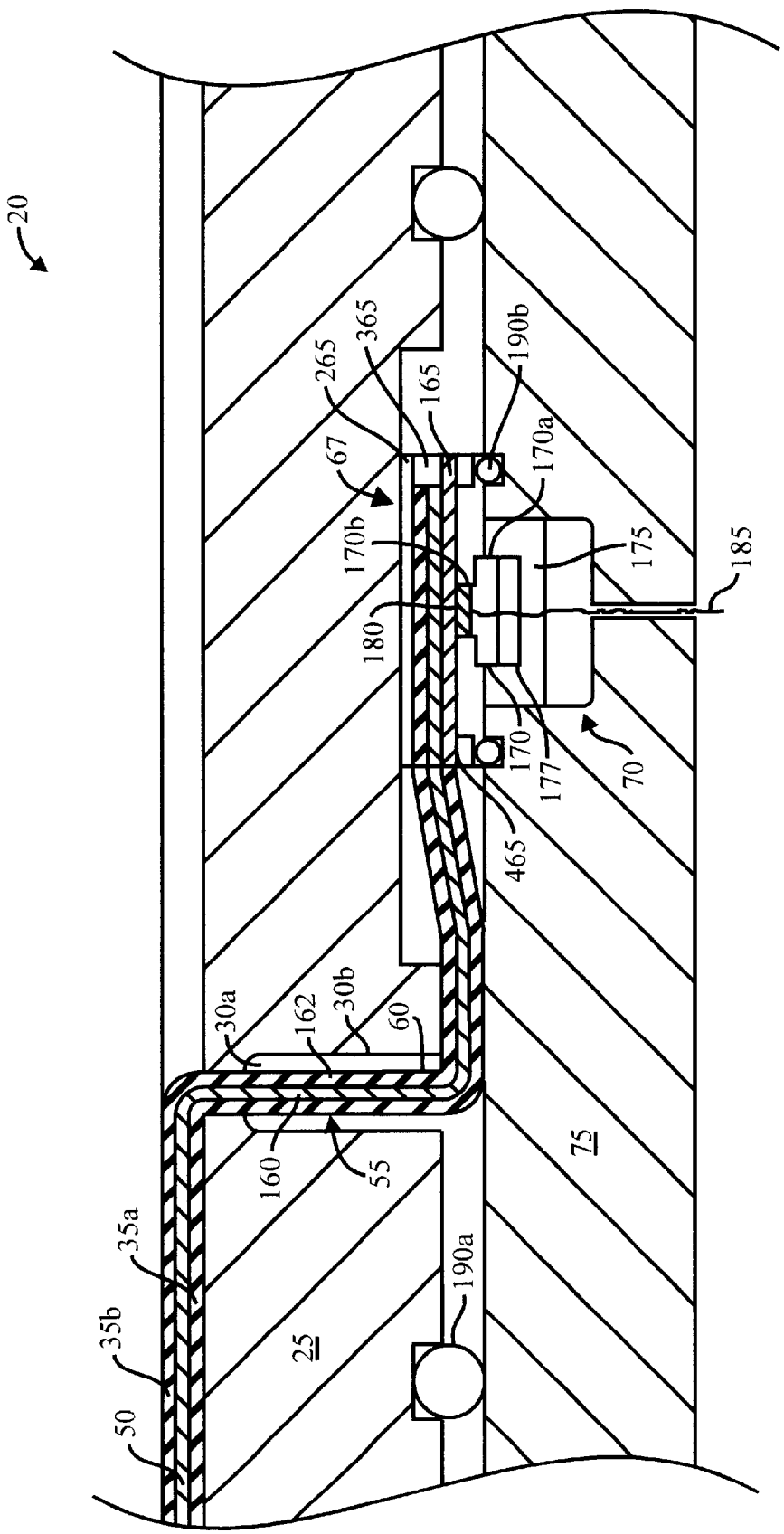
FIG. 2a is a partial sectional, side elevational view of an embodiment of an electrostatic chuck of the present invention, on a support in a process chamber, showing the electrical connector extending through the base and a high voltage contact assembly used to electrically engage the electrical connector to a voltage supply terminal on the support.
Figure 2B:
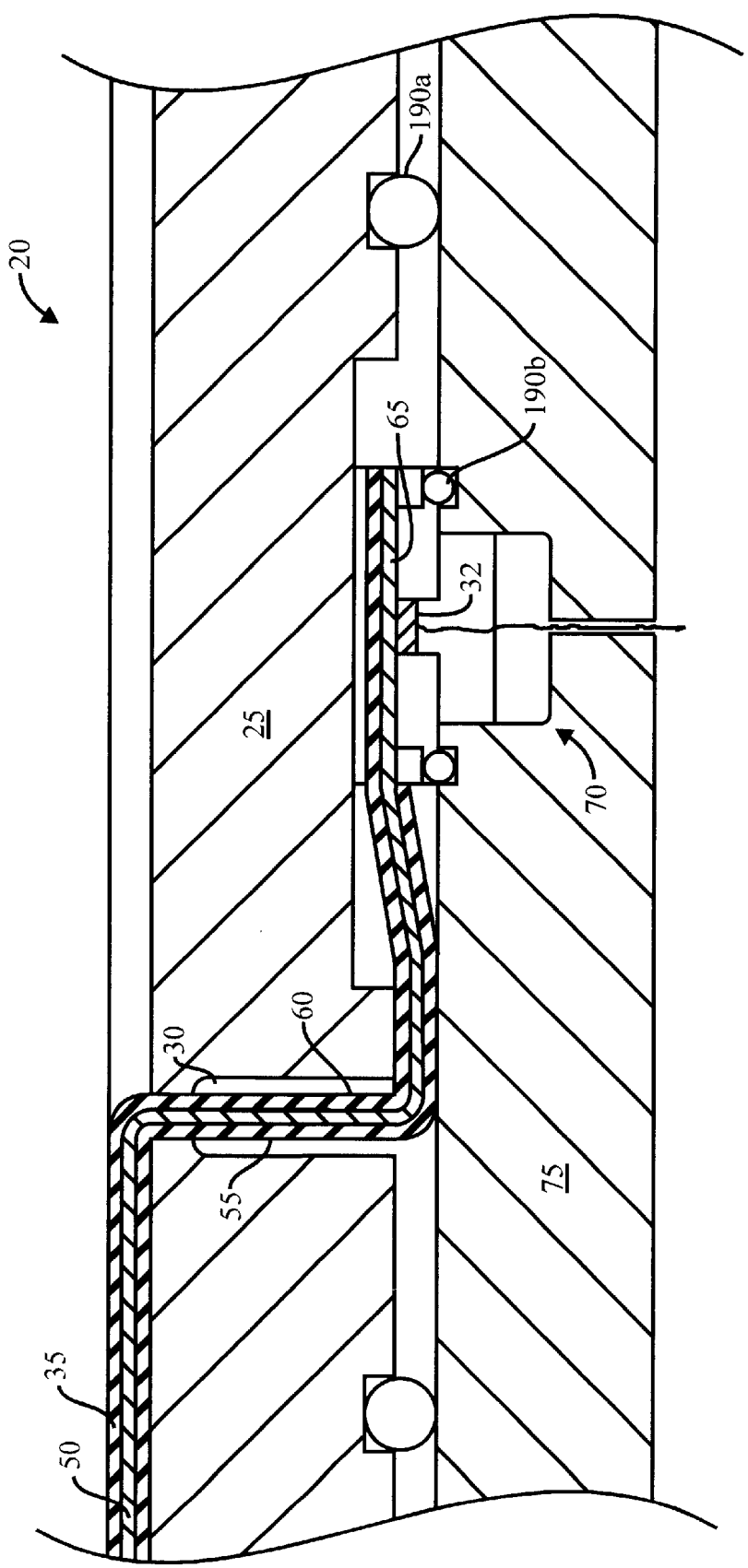
FIG. 2b is a partial sectional side elevational view of another version of the electrostatic chuck of the present invention, on a support in a process chamber, showing the electrical connector integral with the electrode and having an electrical contact for directly electrically engaging a voltage supply terminal on the support.

Certain features of the chuck 20 of the present invention which provide significant advantages over prior art chucks will now be described. One feature comprises placement of the electrical lead 60 of the electrical connector 55, as shown in FIG. 1a, or the leads 60a, 60b of the connectors 55a, 55b, as shown in FIG. 1b, through the bore 30 in the base 25, instead of around the edge of the base 25. The electrical connectors 55, 55a, and 55b and the leads 60, 60a, and 60b are substantially similar, thus to avoid repetition, the following description refers to the electrical connector 55 and lead 60 to mean any of the above connectors or leads, respectively. Placing the lead 60 of the connector 55 through the bore 30 substantially enhances the erosion resistance of the chuck 20 because when a substrate 45 is held on the chuck 20, the substrate 45 substantially entirely covers the electrical connector 55 of the chuck 20 and reduces exposure of the electrical connector to the erosive process gas in the process chamber 80. The reduced exposure limits erosion of the electrical connector 55, thereby increasing the lifetime of the chuck 20. Two illustrative configurations for the electrical connector 55 are shown in FIGS. 2a and 2b. FIG. 2a shows an electrical connector 55 comprising an electrical lead 60, having one end electrically connected to the electrode 50 and the other end electrically connected to an electrical contact assembly 67. The electrical contact assembly 67 allows the lead 60 to electrically contact a voltage supply terminal 70 on the support 75 in the process chamber 80. FIG. 2b shows an alternative version of the electrical connector 55 in which the electrical lead 60 comprises an electrical contact 65 that is an integral extension of the lead 60. More preferably, the entire electrical connector 55, namely the lead 60 and the electrical contact 65, form an integral extension of the electrode 50. By "integral extension" it is meant that the electrical lead 60 and the electrical contact 65, or the electrical connector 55 and electrode 50, are fabricated from a unitary electrically conductive member. Fabricating the electrical contact 65 as an integral extension of the electrical lead 60, or the entire electrical connector 55 as an integral extension of the electrode 50, precludes fabrication of the multi-component contact assembly 67 and simplifies assembly of the chuck 20. Fabrication of the different versions of the electrical connector 55 is described in more detail below.

The erosion resistance of the chuck 20 can be further enhanced by directing a non-reactive masking gas, such as inert gas, onto a peripheral edge or perimeter 110 of the insulator 35 as shown in FIG. 1a. Because the peripheral insulator edge 110 is not covered by the substrate 45, it is exposed to the erosive process gas in the chamber 80. Directing a non-reactive gas such as argon or helium on the peripheral insulator edge 110 limits its exposure to erosive gas and reduces erosion of the insulator 35. Preferably, the masking gas is directed on the peripheral insulator edge 110 using a masking gas assembly 115 which is integral with the base 25. The masking gas assembly 115 comprises a circumferential collar 120 around the base 25 of the chuck 20, the collar 120 being spaced apart from the peripheral edge 110 of the insulator 35 to form a narrow channel 125 around the peripheral edge 110 of the insulator 35. Maintaining masking gas in the channel 125 reduces exposure of the peripheral insulator edge 110 to the erosive process gas in the chamber 80, thereby reducing the rate of erosion of the peripheral insulator edge 110, which increases the useful life of the chuck 20.

The masking gas also reduces polymeric byproduct and particulate contaminant deposition on the peripheral edge 110 of the insulator 35, on the substrate 45, and on adjacent surfaces. When the polymeric insulator 35 is eroded by the erosive plasma in the chamber 80, polymeric byproduct and particulate contaminants are formed. The byproducts and contaminants deposit upon and contaminate the insulator 35, the substrate 45, and process chamber walls. When byproducts and contaminants contact and adhere to the substrate 45, they contaminate the substrate 45 and reduce the yield therefrom. Polymeric byproducts can also deposit on the masking gas assembly 115 and adjacent surfaces necessitating frequent cleaning of these surfaces. The masking gas reduces the rate of formation of polymeric byproduct and contaminants by reducing erosion of the insulator 35, and limiting plasma formation adjacent the insulator 35, by maintaining a barrier in the form of a continuous curtain of gas exiting the masking gas assembly 115. Also, by maintaining a continuous upwardly flowing barrier of gas about the insulator edge 110, polymeric byproduct or other contaminants which would otherwise collect therein are flushed into the chamber 80 and out through the exhaust 84. The reduction of polymeric byproducts in the areas adjacent the insulator edge 110 reduces contamination of the substrate 45, and reduces deposition of byproducts in the process chamber 80.

Figure 1C:
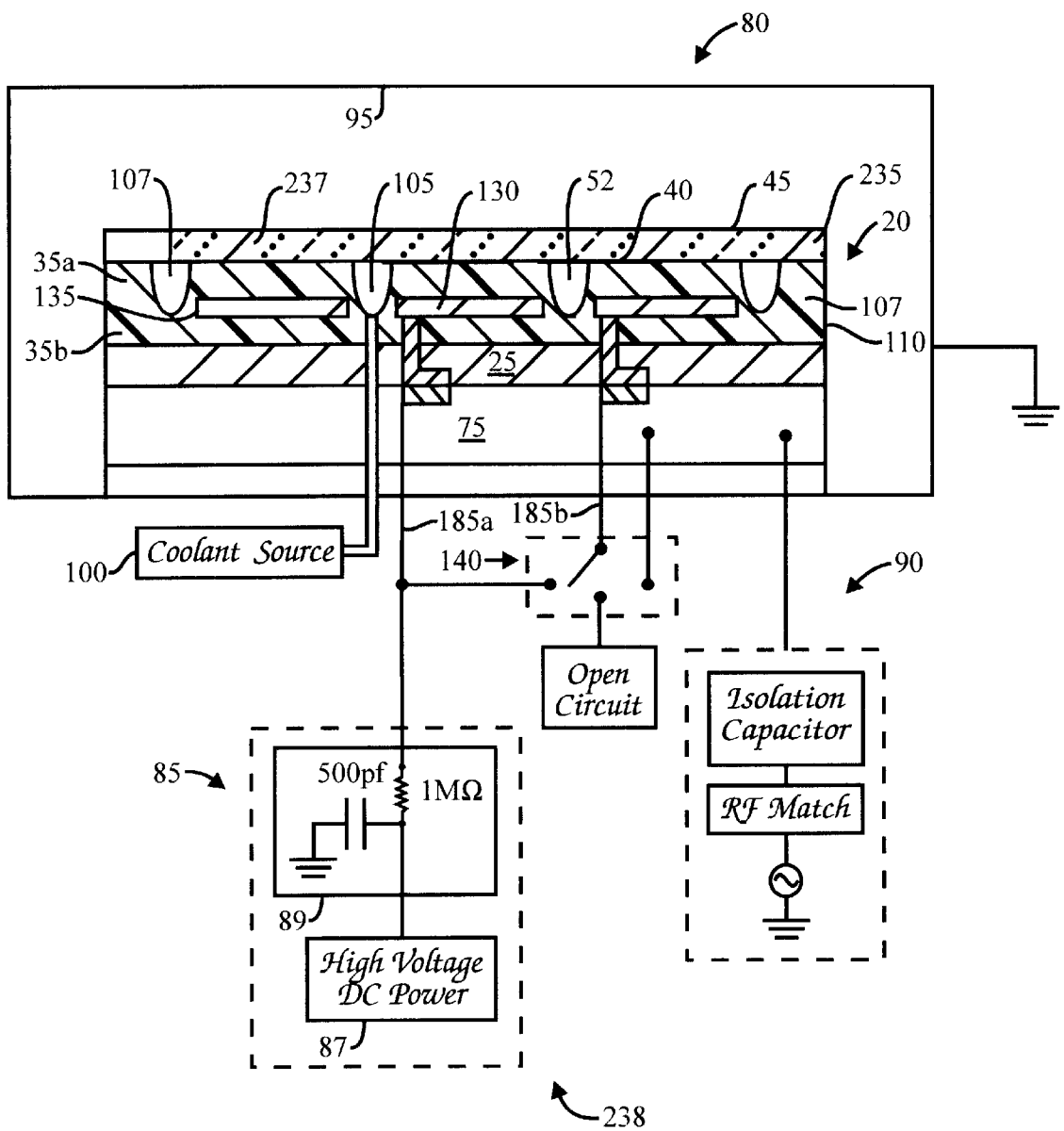
FIG. 1c is a cross-sectional, side elevational schematic view of a process chamber showing operation of an electrostatic chuck having two electrodes, and showing a switching system for operating the chuck in a bipolar mode or in a monopolar mode.

Several features of the multi-electrode or two electrode versions of the chuck, shown in FIGS. 1b and 1c, are also advantageous. In these versions, the chuck 20 comprises multiple electrodes, typically first and second electrodes 130, 135, with electrical isolation voids 52 therebetween for electrically isolating the electrodes 130, 135 from one another so that each electrode can be maintained at opposing electrostatic polarities. In one advantageous configuration, the electrodes 130, 135 and the electrical isolation voids 52 therebetween are sized and configured so that the electrical isolation voids 52 can serve as cooling grooves 105 for holding coolant for cooling the substrate 45 on the chuck 20. The cooling grooves 105 can be formed in the isolation voids 52 by cutting through the insulator 35 overlying the isolation void 52 so that the cooling grooves 105 extend through the insulator 35 as shown in FIG. 1b, or the insulator can recede into the isolation voids 52 to form cooling grooves 105 positioned between the electrodes 130, 135 as shown in FIG. 1c. This configuration allows utilization of the isolation voids 52 between the electrodes 130, 135 to hold coolant without necessitating additional cooling grooves to be cut through the electrodes, thereby maximizing the effective area and electrostatic force of the electrodes 130, 135. For example, FIG. 3 shows a double ring electrode configuration comprising an inner electrode ring 130 and an outer electrode ring 135, with an electrical isolation void 52 therebetween. The electrical isolation void 52 between the two electrodes 130, 135 is used to form a cooling groove 105, allowing maximization of the electrode area. Preferably, the electrodes 130, 135 are coplanar and have substantially equivalent areas so that the electrodes generate equivalent electrostatic clamping forces on the substrate 45.

Figure 4:
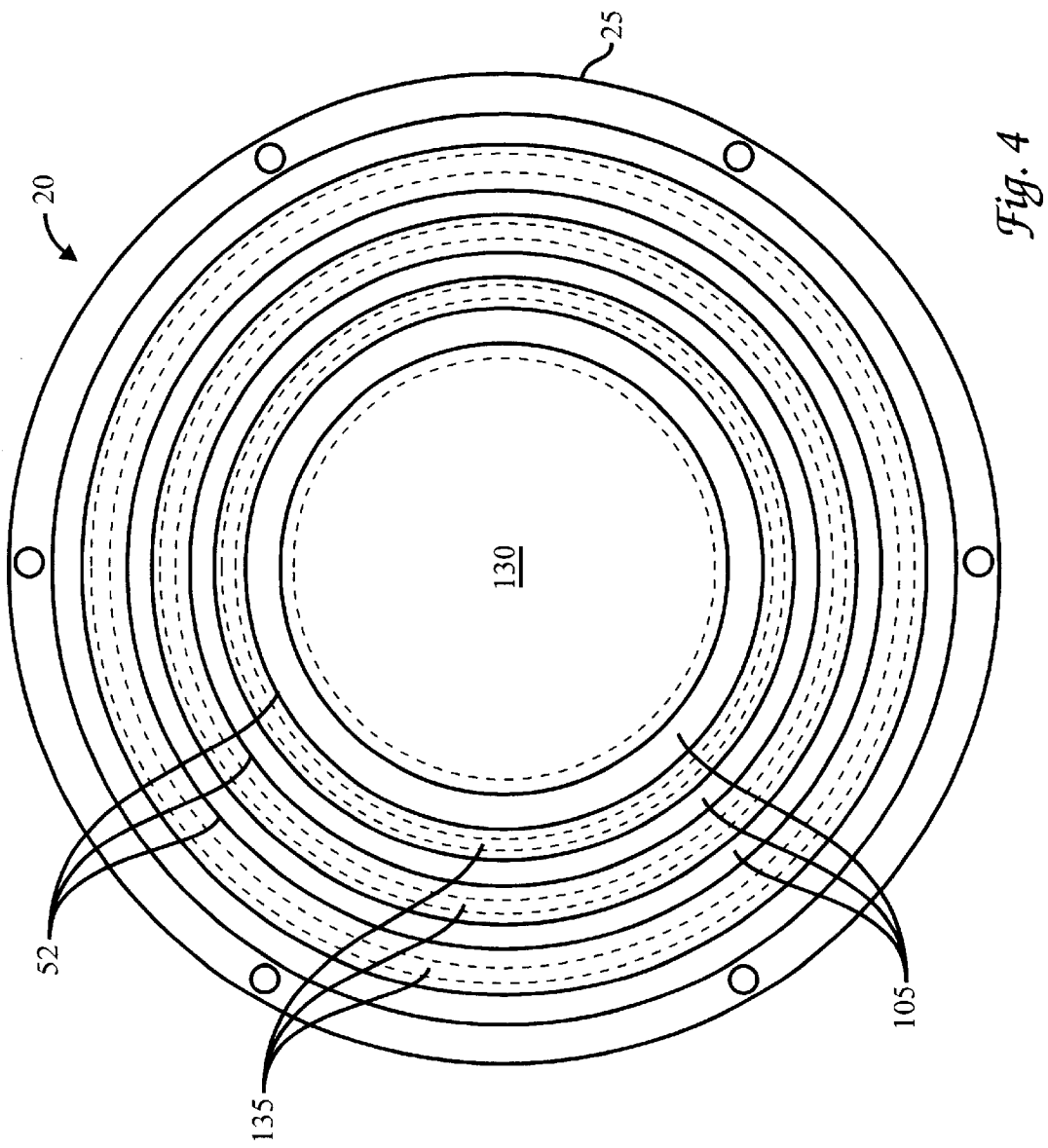
FIG. 4 is a top plan view of another version of an electrostatic chuck having a multiple ring electrode configuration with cooling grooves between the electrodes at the peripheral edge of the chuck.

In a preferred bipolar configuration, shown in FIG. 1c, the electrodes 130, 135 and isolation voids 52 therebetween are sized and configured so that at least a portion of the electrical isolation voids 52 are positioned at the peripheral edge 110 of the insulator 35 so that coolant held in the cooling grooves 105 in the voids 52 at the peripheral edge 110 of the insulator 35 can cool a perimeter or edge 235 of the substrate 45 held on the chuck 20. For example, in the electrode configuration shown in FIG. 4, the electrodes 130, 135 are shaped and sized to form electrical isolation voids 52 comprising ring-shaped grooves which are arranged sufficiently close to the peripheral edge 110 of the insulator 35 that when the coolant is held in the grooves 105, the coolant in the grooves 105 cools the perimeter 235 of the substrate 45 without substantially leaking out from the grooves 105. In FIG. 4, the first electrode 135 comprises three outer ring electrodes and the second electrode 130 comprises a single solid inner circle. When a substrate 45 is held on the chuck 20, the substrate 45 presses against the ridges formed by the portions of the insulator 35 overlying the electrodes 130, 135 and seals the coolant grooves 105 so that coolant does not leak out from the grooves 105. Thus coolant can be distributed evenly and close to the perimeter 235 of the substrate 45 without leaking from the grooves 105.

Figure 5:
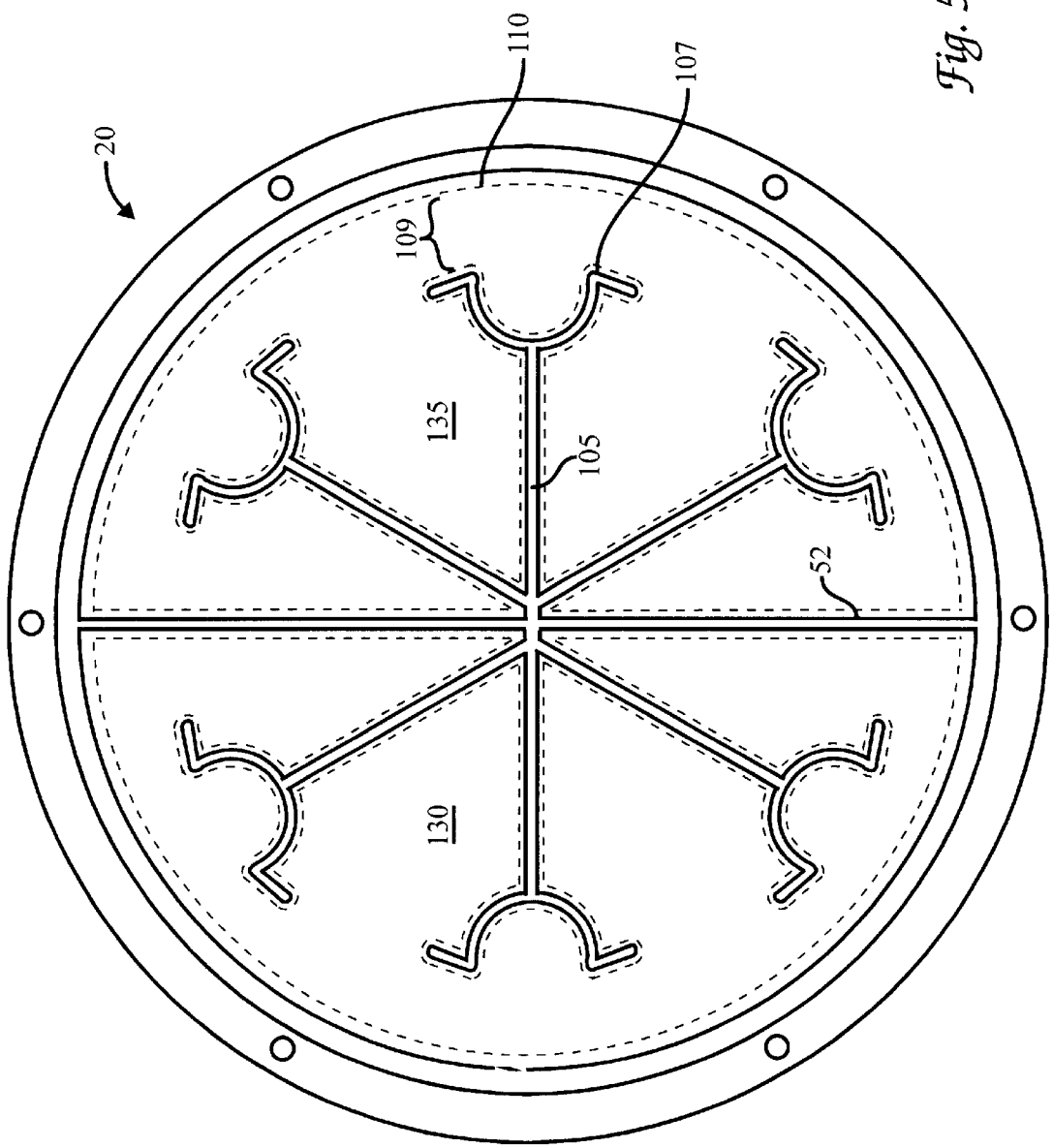
FIG. 5 is a top plan view of another version of an electrostatic chuck having two semicircular electrodes with radial cooling grooves between the electrodes.

Another preferred configuration for the multi-electrode chuck 20 comprises two semicircular electrodes 130, 135, separated by at least one electrical isolation void 52 that extends radially across the insulator 35, as shown in FIG. 5. The radially extending isolation void 52 is used to form a cooling groove 105 which extends close to the peripheral edge 110 of the insulator 35. The chuck 20 can also include additional radially extending cooling grooves 105 having groove tips 107 which extend close to the peripheral edge 110 of the insulator 35. The groove tips 107 are positioned close to the peripheral edge 110 of the insulator 35 and define a gap 109 with the edge 110. The coolant in the tips of the grooves 105 maintains the temperatures at the perimeter 235 of the substrate 45 substantially equivalent to the temperatures at the center 237 of the substrate 45, the average difference in temperature between the perimeter 235 and center 237 of the substrate 45 being preferably less than about 10° C. Most preferably the coolant maintains substantially the entire substrate 45 at constant temperatures.

Another novel features of the present invention allows use of a multi-electrostatic chuck 20 in processes having both plasma and non-plasma stages. This feature comprises a switching system 238 which uses a switch 140 that allows operation of the electrodes 130, 135 as monopolar electrodes during plasma process stages, and as bipolar electrodes during non-plasma process stages. In a preferred configuration, as shown in FIG. 1c, this switching system 238 comprises a switch 140 having three positions, namely (i) a monopolar position, (ii) a bipolar position, and (iii) an open circuit position. In the monopolar position, the switch connects both electrodes 130, 135 to the first voltage supply 85, thereby maintaining both electrodes 130, 135 at the same electrical potential, so that the electrode serves as a monopolar electrode. Simultaneously, the second voltage supply 90 is activated to electrically bias the support 75 to form a plasma in the chamber 80. The electrically charged species of the plasma impinge on the substrate 45 and maintain the substrate 45 at an opposing electrical potential to that of the electrodes 130, 135. The opposing electrical potentials cause opposing electrostatic charge to accumulate in the substrate 45 and in the electrodes 130, 135, thereby resulting in an attractive electrostatic force which holds the substrate 45 to the chuck 20.

In the bipolar position, the switch 140 connects the first electrode 130 to the first voltage supply 85 so that the electrode 130 is maintained at a first electrical potential and connects the second electrode 135 to the support 75. During bipolar operation, the second voltage supply 90 is deactivated, and the support 75 is electrically ground. Thus, the electrode 130 is maintained at a positive potential by the voltage supply 85, and the second electrode 135 is maintained at an opposing electrical potential, namely electrical ground. Thus, during the non-plasma stages of the process, the switchable system allows the electrodes 130, 135 to be maintained at opposing electrical potentials, so that the electrodes operate as bipolar electrodes.

Typically, the first voltage supply 85 is similar to the electrical circuits described above, and includes a high voltage DC power supply 87 and an alternating current filter 89. Typically, the DC power supply 87 provides a DC voltage ranging from about 1000 to 3000 volts, and more preferably from about 2000 volts.

The open circuit position of the switch 140 is used to transition the electrodes 130, 135 between the monopolar and bipolar operational modes. When the process is transitioned from a plasma to a non-plasma stage, the plasma in the chamber 80 cannot be instantaneously evacuated, and some electrical charged plasma species remain in the chamber 80 for a short period after the second voltage supply 90 is turned off. Thus, in between the plasma and non-plasma process stages, the switch 140 is set to the open circuit position, in which no electrical potential is maintained in the electrodes 130, 135. In this manner, the open circuit position acts to delay or stabilize the transition between the monopolar and bipolar operational modes of the electrodes 130, 135.

The switchable system is advantageous for processes which comprise both plasma and non-plasma stages. During the non-plasma stage of the process, such as when the substrate 45 is being heated to process temperatures, the switchable system allows the electrostatic chuck 20 to be used in a bipolar mode, with one electrode 130 electrically charged and the other electrode 135 electrically grounded, to electrostatically hold the substrate 45 without use of a plasma. During the plasma stage of the process, the switchable system allows the chuck 20 to be operated in a monopolar mode, which provides increased electrostatic clamping force to prevent movement or misalignment of the substrate 45.

Particular aspects of the chuck 20 will now be discussed.

Base

The base 25 of the chuck 20, also known as the pedestal, is provided for supporting the electrostatic member 33 comprising the insulator 35 with the electrode 50 therein, as shown in FIG. 1a. Generally, the base 25 has a shape and size corresponding to the shape and size of the substrate 45 to maximize the heat transfer surface between the base 25 and the substrate 45, and to provide a wide surface for holding the substrate 45. For example, if the substrate 45 is disk shaped, a right cylindrically shaped base 25 is preferred. Alternatively, the base 25 can have a shape different from the shape of the substrate 45 or a size different from the size of the substrate 45.

Typically, the base 25 is made from aluminum and has a right cylindrical shape, with a diameter of about 100 mm, to 225 mm (4 to 9 inches), and a thickness of about 1.5 cm to 2 cm. The top and bottom surfaces of the aluminum plate are ground using conventional aluminum grinding techniques, until the surface roughness of the plate is less than about 1 micron. Surface grinding of the plate is essential for the base 25 to uniformly contact the support 75, and the substrate 45 placed on the base 25, to allow for efficient thermal transfer between the substrate 45 and the support 75. After grinding, the plate is thoroughly cleaned to remove grinding debris.

The base 25 has a bore 30 therethrough, which includes a slot portion 30a and an enlarged counterbore portion 30b extending from the slot portion 30a, as shown in FIG. 2a. The bore 30 is sized sufficiently large to insert the electrical lead 60 or the electrical lead and integral electrical contact 65 therethrough with minimal or substantially no clearance. Preferably, the bore is sized sufficiently small such that when the electrical lead 60 of the electrical connector 55 is in the bore 30, substantially no gas leaks from the bore 30. A suitable clearance is less than about 5 mm.

Figure 9:
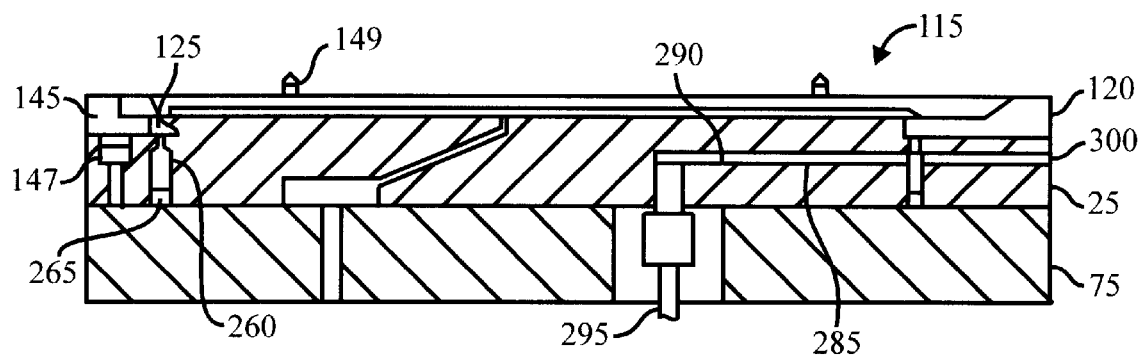
Figure 10:
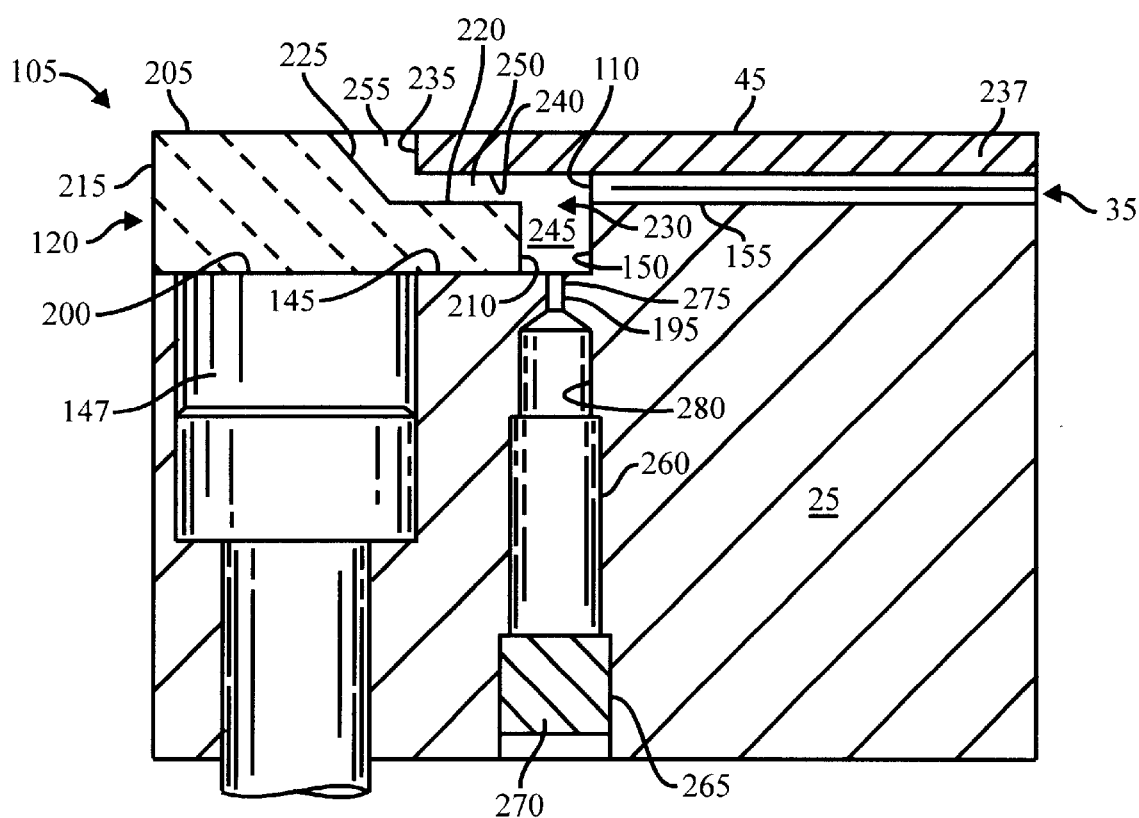
FIG. 10 is another partial cross-sectional, side elevational view of the electrostatic chuck and masking gas assembly of FIG. 9.

An alternative version of the base 25 can be configured to have a collar ledge 145 extending around a perimeter wall 150 of the base 25, as shown in FIGS. 9 and 10. The collar ledge 145 is at a reduced height from a central portion 155 of the base 25, such that the base 25 resembles a pedestal. The collar ledge 145 has holes 147 therethrough, which can receive bolts, for securing the chuck 20 to the support 75 in the process chamber 80. Additionally, the base 25 can include a plurality of DC pick up pins 149, as shown in FIG. 9, extending upwardly into the enclosure of the process chamber 80. The DC pick up pins 149 can be formed from the same electrically conductive material as the support 75 and base 25. The DC pick up pins 149 form a conductive path, for the electrical charge, from the energized support 75 to the process gas introduced into the process chamber 80, to facilitate plasma generation within the process chamber 80.

Insulator

The insulator 35 on the base 25 of the chuck 20 typically comprises an electrically insulative polymeric material, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber.

Preferably, the insulator 35 is resistant to temperatures in excess of 50° C., and more preferably to temperatures in excess of 100° C., so that the chuck 20 can be used for processes where the substrate 45 is heated. Also, preferably, the insulator 35 has a high thermal conductivity so that heat generated in the substrate 45 during processing can dissipate through the chuck 20. The thermal conductivity of the insulator 35 should be at least about 0.10 Watts/m/° K, to allow sufficient heat transfer to preclude overheating of the substrate 45.

The insulator 35 can also include a high thermal conductivity filler material, such as diamond, alumina, zirconium boride, boron nitride, and aluminum nitride for increasing the thermal conductivity and resistance to plasma erosion. Preferably, the filler material is a powder with an average particle size of less than about 10 $\mu$m. Typically, the filler is dispersed in the insulative material in a volumetric ratio from about 10% to 80%, and more typically from about 20% to 50%.

The insulator 35 is sized sufficiently large to enclose the electrode therein. The overall thickness of the insulator 35 varies according to the electrical resistivity and dielectric constant of the insulative material used to form the insulator 35. Typically, the insulator 35 has a resistivity ranging from about $10^{13}$ $\Omega$cm to $10^{20}$ $\Omega$cm, and a dielectric constant of at least about 2, and more preferably at least about 3. When the insulator 35 has a dielectric constant of about 3.5, the entire thickness of the insulator 35 is typically about 10 $\mu$m to about 500 $\mu$m thick, and more preferably from about 100 $\mu$m to about 300 $\mu$m thick. When a polyimide is used as the insulative material, the insulator has a dielectric breakdown strength of at least about 100 volts/mil (3.9 volts/micron), and more typically at least about 1000 volts/mil (39 volts/micron).

Preferably the insulator 35 comprises a two layer laminate structure, as shown in FIG. 1a, comprising a lower insulative layer 35a and an upper insulative layer 35b, between which the electrode is embedded. Preferably, the lower and upper insulative layers 35b, 35a have substantially equivalent thicknesses of from about 50 $\mu$m to about 60 $\mu$m thick, and the electrode 50 is preferably less than about 50 $\mu$m thick. A method of fabricating the two-layer structure is described below.

Additionally, a protective coating (not shown) can be applied on the upper surface 40 of the insulator 35 to protect the insulator 35 from chemical degradation when the chuck 20 is used in corrosive and erosive processing environments. Preferred protective coatings and processes for their fabrication are described in more detail in, for example, U.S. patent application Ser. No. 08/052,018, filed on Feb. 22, 1993, entitled "Protective Coating for Dielectric Material of Wafer Support Used in Integrated Circuit Processing Apparatus and Method of Forming the Same," by Wu, et al., which is incorporated herein by reference.

Electrode

The single monopolar electrode 50 and the multiple bipolar electrode 130, 135 are both made from an electrically conductive material, such as for example, metals such as copper, nickel, chromium, aluminum, iron, and alloys thereof. The shape and size of the electrode 50 varies according to the size and shape of the substrate 45. For example, as shown in the drawings, if the substrate 45 is disk shaped, the electrode 50 is also disk shaped to maximize the area of the electrode in contact with the substrate 45. Preferably, the area of the electrode 50 covers substantially the entire insulator 35. Typically, the total area of the electrode 50 is from about 50 to about 500 sq. cm., and more preferably from about 80 to about 380 sq. cm. For the bipolar electrode configurations, the area of each of the two electrodes 130, 135 is substantially equivalent and typically comprises about one-half of the total area of the top surface of the chuck 20. Thus, the area of each electrode 130, 135 is from about 50 to about 250 sq. cm., and more preferably from about 100 to about 200 sq. cm.

Typically, the thickness of the electrodes 50 is from about 1 $\mu$m to 100 $\mu$m, and more typically is from about 1 $\mu$m to 50 $\mu$m. However, in certain bipolar configurations, it is advantageous to utilize thinner electrodes in order to effectively seal the tips 107 of the cooling grooves 105 which extend to the peripheral edge 110 of the insulator 35. Generally, the center portion of the insulator 35 overlying the electrode 130 is raised relative to the lower peripheral edge 110 of the insulator 35. Thus, when a substrate 45 is held on the chuck 20, the substrate 45 does not effectively contact the insulator edge 110 and does not effectively seal the grooves 105 at the insulator edge 110. A thinner electrode in the insulator 35 lowers the height of the central insulator portion relative to the peripheral edge 110 of the insulator 35, thereby allowing the substrate 45 to more effectively contact and seal the cooling grooves 105 at the peripheral edge 110 of the insulator 35 so that the coolant does not leak from the grooves 105. For example, in the bipolar chuck 20 having two semicircular electrodes, as shown in FIG. 5, coolant grooves 105 are formed in the electrical isolation voids 52 which extend to the edge 110 of the insulator 35. The gaps 109 between the tips 107 of the cooling grooves 105 and the insulator edge 110 are more effectively sealed when a thinner electrode is used in the insulator 35. Thus, preferably the electrode has a thickness of less about 1 $\mu$m, and more preferably less than 0.5 $\mu$m.

Figure 6A:
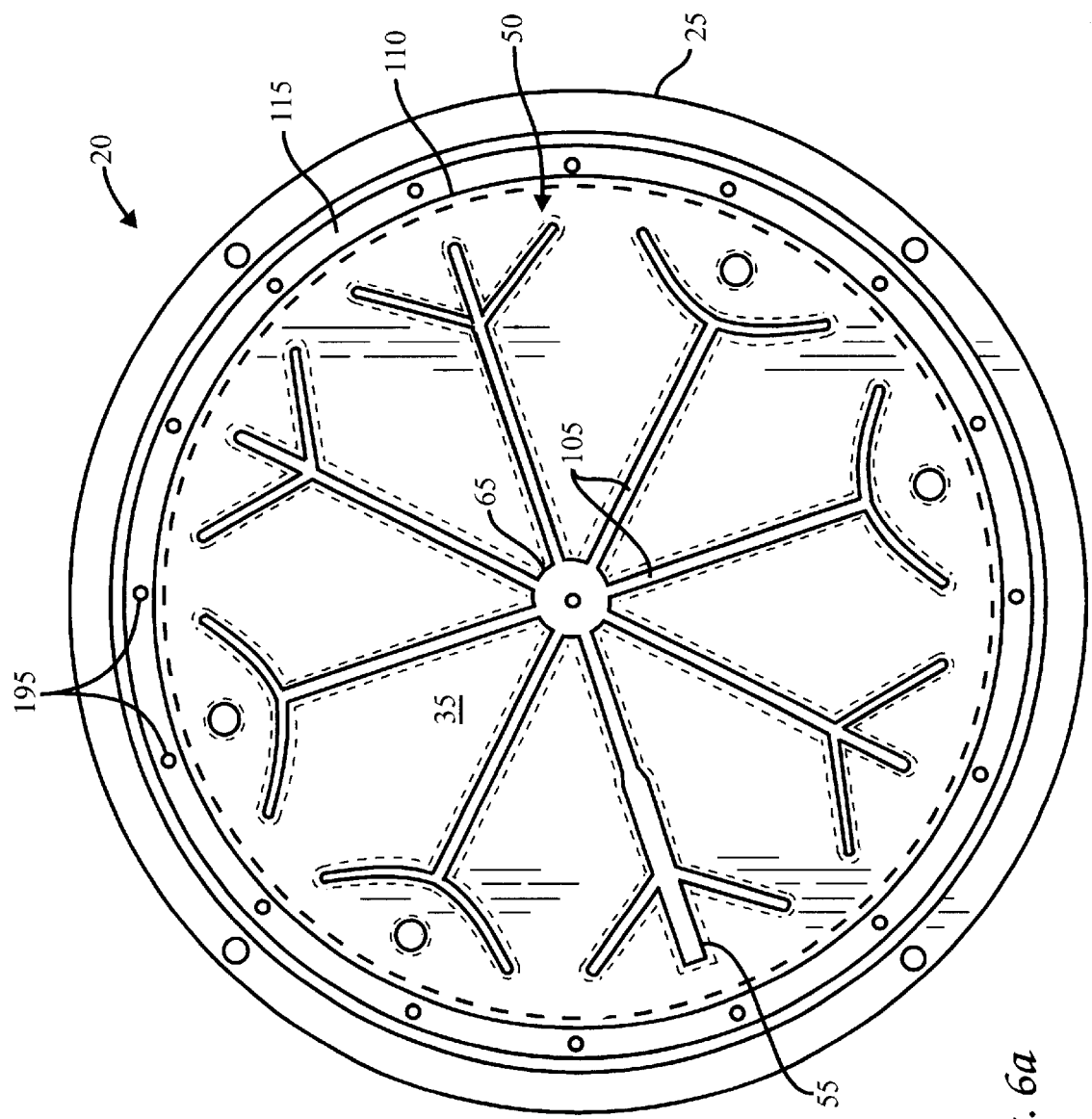
FIG. 6a is a top plan view of an electrostatic chuck having an electrical lead integral with the electrode, the electrical lead being cut out from the electrode portion in between a cooling groove.
Figure 6B:
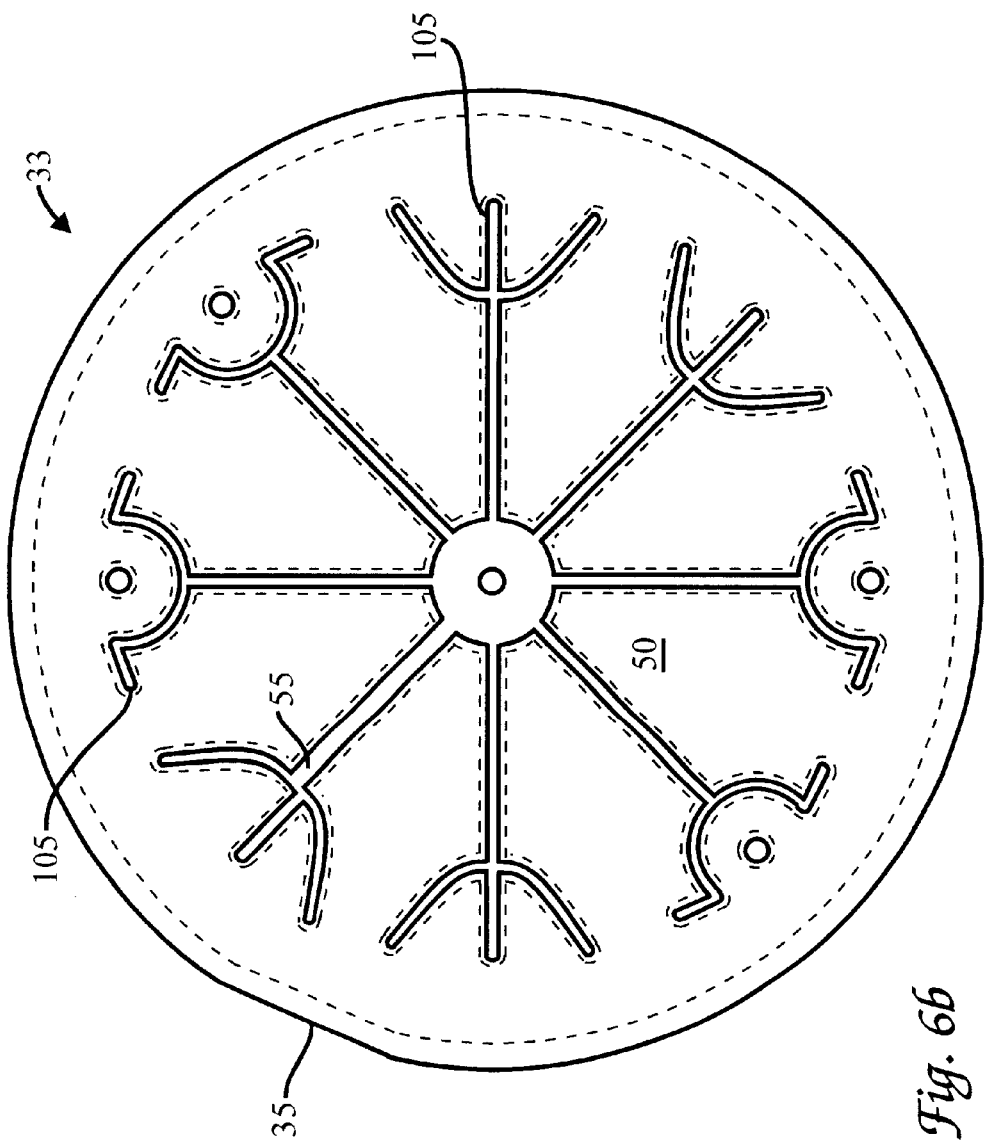
FIG. 6b is a top plan partially fabricated view of an electrostatic chuck showing an electrical connector integral with the electrode and positioned in a cooling groove.
Figure 6C:
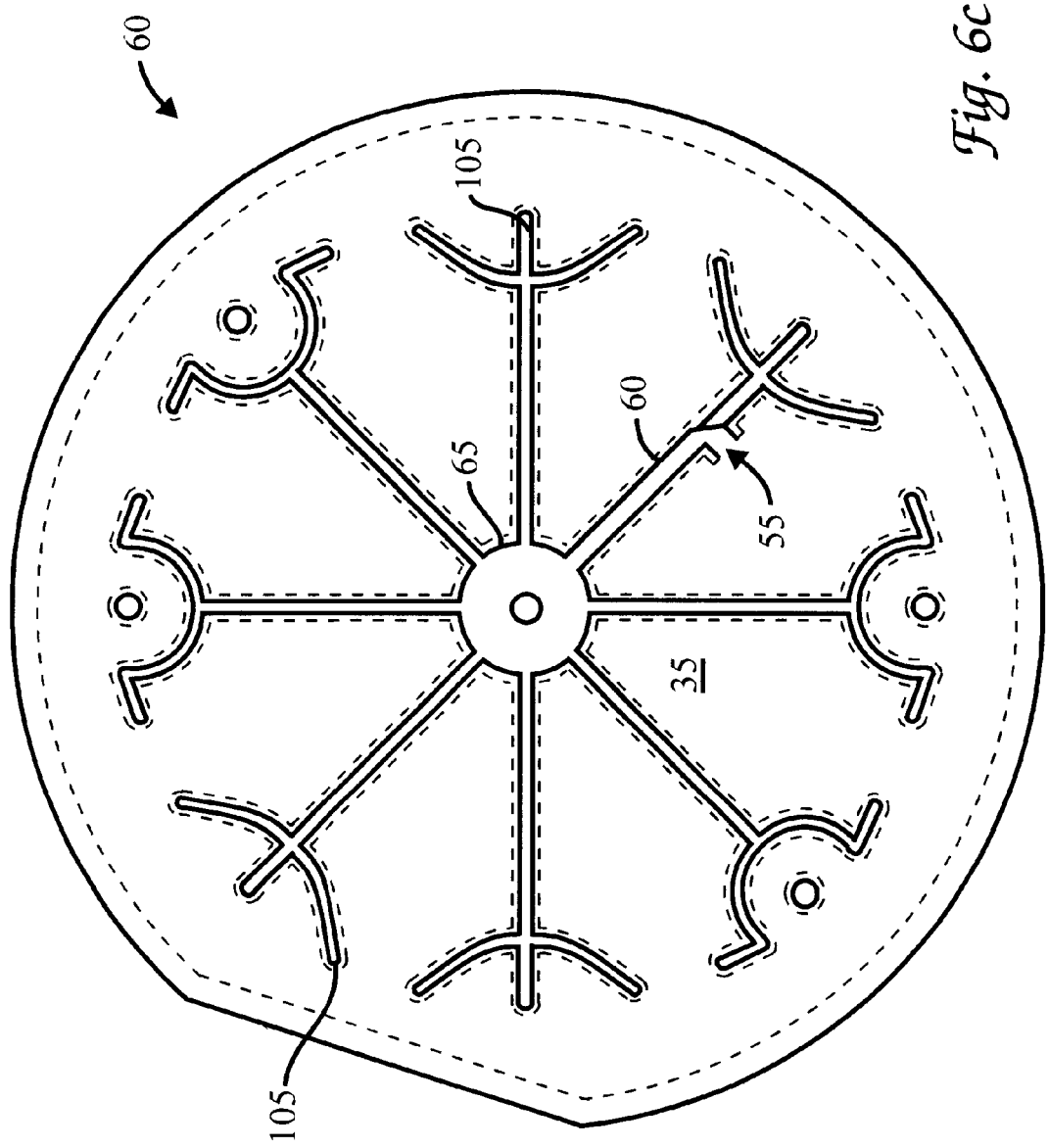
FIG. 6c is a top plan partially fabricated view of another version of the electrostatic chuck of FIG. 6b.
Figure 7A:
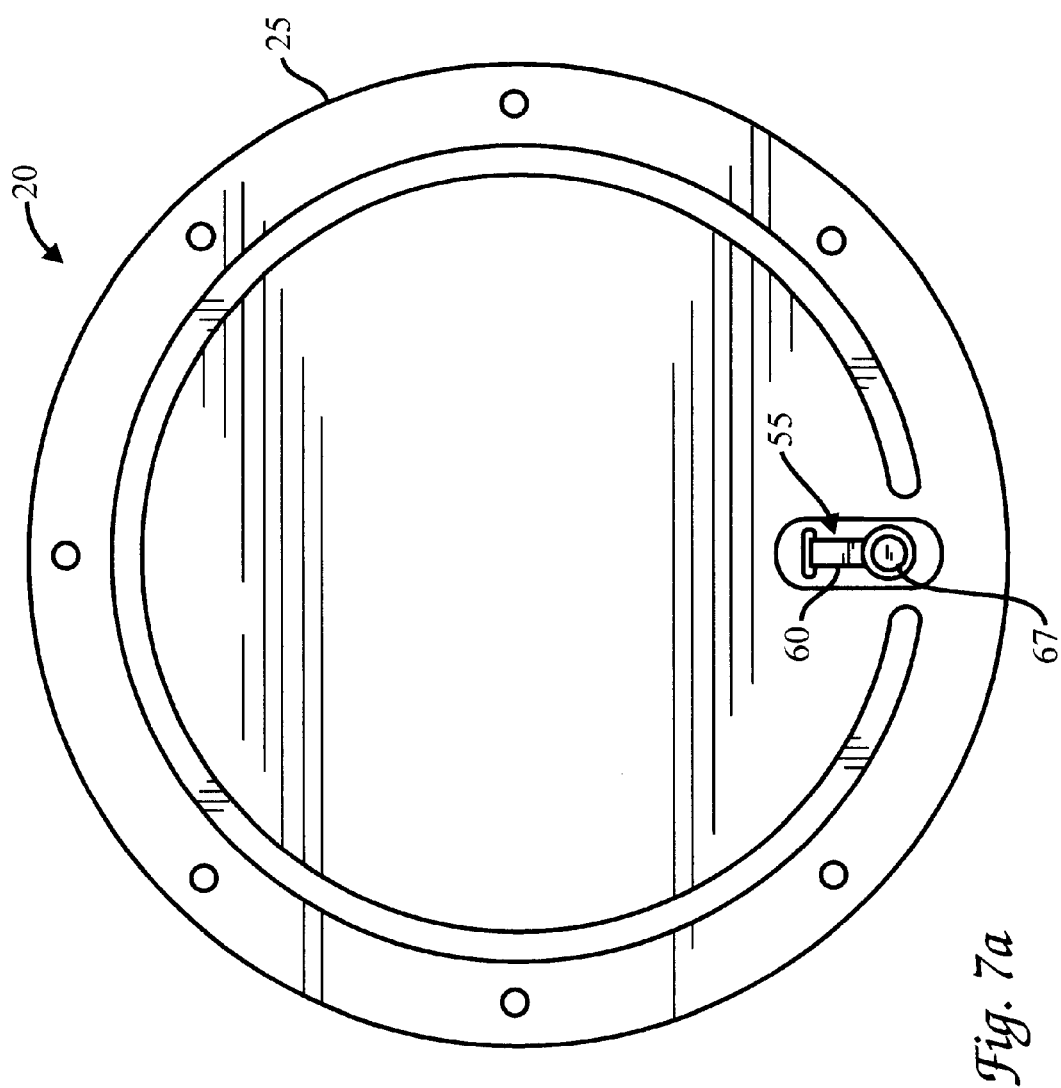
FIG. 7a is a bottom plan view of the electrostatic chuck of FIG. 2a showing the high voltage contact assembly on the electrical connector below the base.

The monopolar electrode 50 and bipolar electrodes 130, 135 can either be continuous or patterned with interconnected features, the features sized so that cooling grooves 105 can be formed between the features for holding a coolant for cooling the substrate 45 held on the chuck 20. For example, FIGS. 6a–6c show monopolar chucks patterned having a plurality of cooling grooves 105. Preferably, the bipolar electrodes 130, 135 are shaped and sized so that the electrical isolation voids 52 between the electrodes can be used to hold coolant for cooling the substrate 45 held on the chuck 20 as described above.

Electrical Connector

When the electrode 50 comprises a single monopolar electrode 50, a single electrical connector 55 is used to electrically connect the electrode 50 to the first voltage supply 85. When the electrode 50 comprises two electrodes 130, 135, separate electrical connectors are used to separately electrically connect each of the electrodes 130, 135 to the first voltage supply 85. For both types of electrodes, the electrical connectors are substantially identical and to avoid repetition will only be described once. The electrical connector 55 comprises an (i) electrical lead 60 that extends through a hole 30 in the base 25, and (ii) an electrical contact assembly 67 (FIG. 2a) or an electrical contact 65 (FIG. 2b). The electrical lead 60 is preferably an integral extension of the electrode 50 and the insulator 35, and is preferably formed during the fabrication of the electrode 50 and insulator 35. However, the electrical lead 60 can be fabricated from an electrically conductive metal such as copper or aluminum and brazed or welded to the electrode 50. The electrical lead 60 is sufficiently long to electrically connect the electrode 50 to the electrical contact 65 or contact assembly 67. Typically, the length of the electrical lead 60 is from about 10 mm to about 50 mm, and more typically from about 20 mm to about 40 mm. The width of the electrical lead 60 is from about 2 mm to about 10 mm, and more typically from about 4 mm to about 7 mm.

Illustrative versions of electrical connectors 55 are shown in FIGS. 2a and 2b. FIG. 2a shows an electrical connector 55 comprising an electrical lead 60 which is an integral extension of the electrode 50 and insulator 35, and an electrical contact assembly 67 assembled on the electrical lead 60 below the base 25 of the chuck 20. It is advantageous to fabricate the electrical lead 60 of the electrical connector 55 as an integral extension of the electrode 50 so that it is not necessary to weld or braze the lead 60 to the electrode 50. The electrical lead 60 comprises an electrically conductive core 160 and an insulative sleeve 162 encasing the conductive core 160, where the conductive core 160 and insulative sleeve 162 are extensions of the electrode 50 and insulator 35, respectively. The electrical contact assembly 67 on the lead 60 is configured to electrically contact a voltage supply terminal 70 of the first voltage supply 85 for electrically connecting the first voltage supply 85 to the electrode 50. FIG. 2a shows a preferred version of the contact assembly 67 comprising a laminated member including a conductive disk 165, an upper insulative disk 265, a slotted disk 365, and a lower washer 465 with a central aperture. A lower layer of the insulative sleeve 162 at the end of the electrical lead 60 is removed to expose the conductive core 160, and the end of the electrical lead 60 is received in a slot of the slotted disk 365. The slotted disk 365 with the inserted exposed conductive core 160 is connected to the conductive disk 165 using an adhesive, such as a conductive adhesive. The conductive disk 165 can include an outer insulative annular portion, or can be a solid conductive disk. The contact assembly 67 is attached below the base 25 of the chuck 20 so that when the base 25 is secured to the support 75 in the process chamber 80, the contact assembly 67 electrically contacts and engages the voltage supply terminal 70 on the support 75.

FIG. 2b shows a version of the electrical connector 55 in which the electrical lead 60 and the electrical contact 65 are both an integral extension of the electrode 50. This version is advantageous because it is not necessary to fabricate or assemble the multicomponent contact assembly 67, or the conductive disk 165, because the terminal 70 directly contacts the exposed conductive core 160 of the lead 60. By integral extension, it is meant that the electrical lead 60, electrode 50, and the electrical contact 65 are fabricated from a single unitary conductive member, such as a sheet of conductive metal. Typically, a continuous sheet of conductive metal is cut out to form the electrode 50 and the electrical connector 55, as shown in FIG. 6b. The electrical contact 65 which is integral with the electrical lead 60 is shaped and sized sufficiently large to directly electrically engage the voltage supply terminal 70 on the support 75, without causing arcing of the high voltage therethrough. Preferably, the area of the electrical contact 65 integral with the lead 60 is at least about the area of the high voltage terminal 70, and more preferably substantially equivalent to the area of the high voltage terminal 70. Preferably, the area of the electrical contact 65 is at least about 50 sq. mm, and more preferably at least about 100 sq. mm. Typically, the area of the electrical contact 65 is from 50 to 400 sq. mm, and more typically from about 75 to 150 sq. mm. Typically, the electrical contact 65 is disk-shaped with a radius ranging from about 5 mm to about 12 mm to provide a sufficient contact area.

Figure 2C:
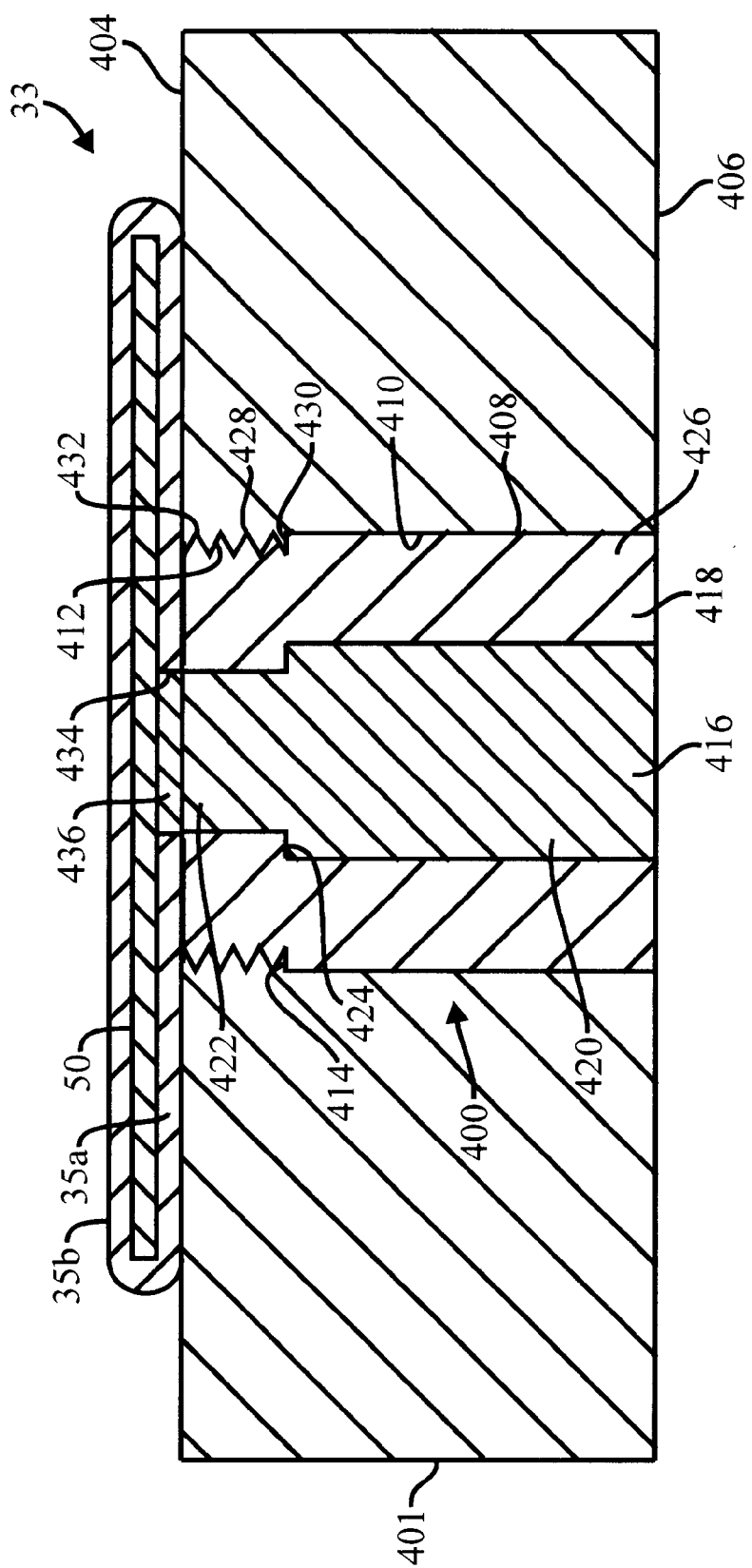
FIG. 2c is a partial sectional side elevational view of an electrostatic chuck showing another version of the electrical connector of the present invention.

FIG. 2c shows another version of the electrical connector 55 which comprises a conductive plug assembly 400 and in which the base 25 is modified to receive the conductive plug assembly 400 therethrough. The modified base 401 is generally a right circular conductive member having a circular top 404, a circular bottom 406, and a central bore 408 extending therethrough from the top 404 to the bottom 406. The bore 408 includes a lower, major diameter portion 410 extending inwardly from the bottom 406 and terminating within the modified base 401, and an upper, minor diameter portion 412 extending from the terminus of the major diameter portion 408 within the modified base 401 to the top 404. An annular ledge 414 is disposed at the intersection of the major diameter portion 410 and the minor diameter portion 412 within the modified base 401. An electrostatic member 33 is adhered to the base top 404 with an adhesive, and the center thereof is aligned with the center of the bore 408. The conductive plug assembly 400 extends through the bore 408 to provide the direct current voltage to the electrostatic member 33 to electrostatically adhere a substrate thereto during processing. The electrostatic member 33 includes a central electrode 50, enclosed in upper and lower dielectric layers 35a, 35b which are adhered to an electrode 50 by glue layers.

The conductive plug assembly 400 is received in the bore 408 and includes an inner copper conductor 416, which is received within an insulative sleeve 410. The conductor 416 is preferably a solid copper member, which includes a lower major diameter portion 420, and an upper minor diameter portion 422, which intersects at an outwardly projecting flange 424. An insulative sleeve 418 is preferably formed from a polyimide material such as Vespel®, available from DuPont Corporation, and likewise includes a lower major diameter portion 426, an upper minor diameter portion 428, and an inwardly projecting radial alignment ledge 430, against which the flange 424 of the conductor 416 is received. A fine helical groove 432 is provided on the outer diameter of the sleeve minor diameter portion 428. The sleeve 418 is preferably press fit into the central bore 408, and an epoxy or other adhesive is preferably located at the interface of the sleeve minor diameter portion 428 and the bore minor diameter portion 412. The fine helical groove 432 increases the surface areas for contact with the epoxy, and ensures an effective epoxy seal between the sleeve 418 and the bore 408. The conductor 416 is preferably press fit into the sleeve 418, with the flange 424 disposed against the ledge 230. After the sleeve 418 and the conductor 416 are fitted into the modified base 401 and the epoxy has cured, the top 404 of the base is ground flat to provide a clean, flat surface to receive electrostatic member 33.

To connect the electrostatic member 33 to the first voltage supply 85, the center of the lower insulative layer 35a of the electrostatic member 33 is removed to form a conductor aperture 434 therethrough corresponding in size to the conductor minor diameter portion 422. A conductive adhesive disk 436, preferably a z-dielectric conductive adhesive disk, is disposed in the aperture 434, to provide a current path from the top of the conductor 416 to the electrode 50. The lower end of the conductor 416 exposed on the base bottom 206 is connected to the direct current power source, through a conductive assembly such as spring loaded pin 170 as shown in FIG. 2a or other means.

The conductive plug assembly 400 provides a leak-tight current path for the first voltage power supply 85 to the electrostatic member 33, while simultaneously providing a non-plasma exposed path. The conductive plug assembly 400 may be used in conjunction with the masking gas assembly to provide a reduced plasma or gas concentration about the peripheral edge 110 of the insulator 35.

Voltage Supply Terminal

Referring to FIG. 2a, a voltage supply terminal 70 suitable for contacting an electrical contact 65 of an electrical connector 55 will now be described. For monopolar electrodes, a single voltage supply terminal 70 is used, and for bipolar electrodes 130, 135, two substantially identical voltage supply terminals 70a, 70b are used. A voltage supply terminal 70 suitable for use in either monopolar or bipolar electrode chucks 20 is described below.

Typically, the voltage supply terminal 70 is located on the support 75 at the interface between the base 25 and the support 75. The voltage supply terminal 70 includes a spring loaded pin member 170 disposed in a bore 175 through the support 75. The pin member 170 typically is a right circular insulative member including a first major diameter portion 170a and a second upwardly projecting minor diameter portion 170b. The second minor diameter portion 170b terminates in a conductive terminal 180 which is preferably gold-plated copper. A high voltage lead 185 extends from the first voltage supply 85 and through the pin member 170 to contact the conductive terminal 180. A spring 177 is disposed in the bore 175 of the support 75 in contact with the pin member 170 to bias the pin member 170 upwardly into contact with the electrical contact 65 of the electrode 50.

The interface between the base 25 and the support 75 is sealed to prevent any coolant passing through the bore 30 of the base 25, from leaking into the process chamber 80. A sealing member 190 comprising two sealing rings 190a, 190b is disposed in the interface between the base 25 and the support 75. A first sealing ring 190a is disposed below the base 25 circumferentially about both the electrical contact 65 and the bore 30 of the base 25. A second sealing ring 190b is disposed circumferentially about the supply bore 175 of the support 75, and in alignment with the electrical contact 65. Preferably, the sealing member 190 includes two O-ring seals.

Masking Gas Assembly

With reference to FIGS. 9 and 10, a masking gas assembly 115 suitable for directing a masking gas over the exposed perimeter 110 of the insulator 35 to reduce erosion of the insulator 35 will now be described. Preferably, the masking gas is a non-corrosive gas, such as helium or argon, but can also include other gases suitable for protecting the insulator 35 from the erosive process gas. The masking gas assembly 115 typically includes a collar 120 provided on the collar ledge 145 of the base 25, and a plurality of gas 120 injection holes 195 in the collar ledge 145 of the base 25. The use of the collar 120 and the plurality of gas injection holes 195 provide a continuous flow of non-reactive gas about the perimeter 110 of the insulator 35 during plasma etch and/or chamber cleaning processes.

Preferably, the collar 120 is a right circular member having an annular base 200 and a top surface 205, with an inner diametrical portion 210 and an outer diametrical wall 215 extending therebetween. A tapered recess having an outwardly projecting annular face 220 terminating in an outwardly angled face 225 is provided between an upper end of the inner diametrical portion 210 and an inner end of the top surface 205. Typically, the collar 120 is made from quartz, ceramics or other materials which can withstand the chamber environment with minimal erosion and particle generation.

The collar 120, base 25, and insulator 35 of the chuck 22 are positioned such that their structural relationship with a substrate 45 held on the insulator 35 defines a circumferential gas manifold 230. The gas manifold 230 insures that an even, continuous barrier curtain of protective masking gas is maintained about the perimeter 110 of the insulator 35. The substrate 45 includes an underside, received on the insulator 35, and a circumferential edge 235. Typically, the substrate 45 is larger than the insulator 35, and includes an overhanging portion 32 extending from the perimeter 110 of the insulator 35 to the circumferential edge 235. The overhanging portion 240 of the substrate 45 overhangs the plurality of gas injection holes 195. Thus, the collar 120, plurality of gas injection holes 195, perimeter wall 150 of the base 25, perimeter 110 of the insulator 35, overhanging portion 240 of the substrate 45, and circumferential edge 235 of the substrate 45, together define a border around the gas manifold 230.

Preferably the manifold 230 includes a series of gaps, including a first gap 245 generally disposed between the collar inner diametrical portion 210 and the perimeter wall 150 of the base 25, a second gap 250 disposed between the collar annular face 220 and the overhanging portion 240 of the substrate 45, and a third gap 255 disposed between the edge 235 of the substrate 45 and the upwardly projecting collar face 225. The non-reactive gas is supplied through the plurality of gas injection holes 195 into the manifold 230, and then passes through the gaps 245, 250, 255, exiting the manifold 230 adjacent the edge 235 of the substrate 45. The gaps are configured to ensure that the gas supplied via the injection holes 195 will substantially fill the manifold 230 before exiting through the third gap 255. Thus, a continuous stream, or curtain, of the non-reactive gas will exit the third gap 255 to limit access of process plasmas and/or plasma cleaning agents to the perimeter 110 of the insulator 35.

To maximize the effectiveness of the manifold 230, the size of the gaps can be adjusted by adjusting the configuration of the collar 120 with respect to the perimeter wall 150 of the base 25, the perimeter 110 of the insulator 35, and the overhanging portion 240 and edge 235 of the substrate 45. Additionally, the gas flow rate through the gas injection holes 195 can also be adjusted to maximize the effectiveness of the manifold 230. For example, during an oxygen plasma clean cycle where the cleaning oxygen flow rate is 300 sccm and the pressure of the process chamber 80 is 700 mTorr, if the gas flow rate of argon through the manifold 230 is 100 sccm and the gaps are each 0.2 cm wide, then the theoretical concentration of erosive cleaning oxygen at the perimeter 110 of the insulator 35 is 39% of the concentration for a non-protected insulator 35. If the second 250 and third 255 gaps are further reduced, the theoretical amount of oxygen or plasma adjacent the perimeter 110 of the insulator 35 is reduced. However, if the first gap 245 is reduced, the theoretical amount of oxygen or plasma adjacent the perimeter 110 of the insulator 35 is increased. Additionally, reducing the non-reactive gas flow rate through the first 245, second 250 and third 255 gaps, and the use of higher diffusivity gases in the manifold 230 will increase the concentration of reactive plasma species about the perimeter 110 of the insulator 35.

Method of Manufacturing Chuck

A preferred process for making an electrostatic chuck 20 according to the present invention, is described below.

The base 25 of the chuck 20 is typically machined from an aluminum plate, cut into a right cylindrical shape with a thickness of about 1.5 to 1.8 cm and a diameter of about 100 to 300 mm, to match the diameter of the substrate 45 which typically ranges from about 127 to about 203 mm (5–8 inches).

The insulator 35 containing the electrode 50 therein, and having an electrical connector 55 integral with the electrode 50 is separately fabricated as an electrostatic member 33. The electrostatic member 33 preferably comprises a laminate having an upper and lower insulative layer 35b, 35a with an electrically conductive electrode 50 sandwiched between the two insulative layers 35a, 35b. Commercially available electrostatic members can be used to form the electrostatic member 33, or the electrostatic member 33 can be fabricated using one of the methods herein. A preferred method of forming the electrostatic member 33 uses a multi-layer film comprising an insulative layer and an electrically conductive electrode layer. A suitable multi-layer film comprises "R/FLEX 1100" film fabricated by Rogers Corporation, Chandler, Ariz., which comprises an electrically conductive copper layer on a 25 to 125 $\mu$m thick polyimide insulative layer. The copper layer of the multi-layer film is etched, routed, or milled to form the electrodes 130, 135 and the integral electrical connector 55 configuration shown in FIG. 6a.

An etching process suitable for forming the electrodes 130, 135 and integral electrical connector 55 comprises the steps of (i) forming a protective resist layer patterned to correspond to the shape of the electrodes 130, 135 and the electrical connector 55, over the electrically conductive layer of the multi-layer film,.and (ii) etching the resist protected multi-layer film using conventional etching processes. The resist layer can be formed using photoresist materials, such as "RISTON" fabricated by DuPont de Nemours Chemical Co., Wilmington, Del., applied on the electrode layer. Conventional photolithographic methods, such as those described in *Silicon Processing for the VLSI Era. Volume 1: Process Technology*, Chapters 12, 13, and 14, by Stanley Wolf and Richard N. Tauber, Lattice Press, California (1986), which is incorporated herein by reference, can be used to pattern the resist layer on the electrically conductive layer. Conventional wet or dry chemical etching methods can be used to etch the multi-layer film. A suitable wet chemical etching method comprises immersing the multi-layer film into an etchant such as ferric chloride, sodium persulfate, or an acid or base, until the unprotected portion of the electrode layer is etched. Suitable dry etching processes are described in *Silicon Processing*, Chapter 16, supra, which is incorporated herein by reference.

After etching the electrically conductive layer to form the electrodes 130, 135 and integral electrical connector 55, a second insulative film is adhered over the conductive layer so that the conductive layer is embedded within the insulator 35 to form the laminated electrostatic member 33. Suitable insulative films include, for example, "KAPTON," a polyamide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan.

The electrostatic member laminate is cut to form the electrical connector 55 that is an integral extension of the electrodes 130, 135, by stamping, punching, or pressing out the electrical connector 55 from the electrostatic member 33. Preferably, the electrical connector 55 is cut out so that the electrical lead 60 and electrical contact 65 of the electrical connector 55 are disposed within one of the patterned grooves 105. Disposing the electrical connector 55 within a segment of the grooves 105 allows fabrication of the electrodes 130, 135, the integral electrical connector 55, and the grooves 105 in a single step process. The single step process is a significant improvement over prior art processes which require multiple and complex fabrication steps to fabricate and assemble the electrical connector 55.

Figure 8:
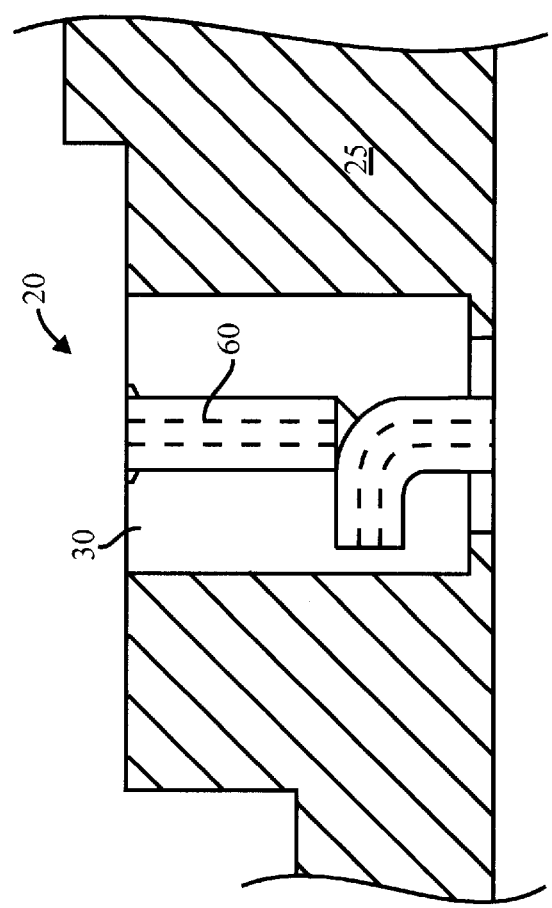
FIG. 8 is a partial sectional, side elevational schematic view of the electrostatic chuck of FIG. 7b at section 8—8 showing the electrical lead folded and extended through the base of the chuck.
Figure 7B:
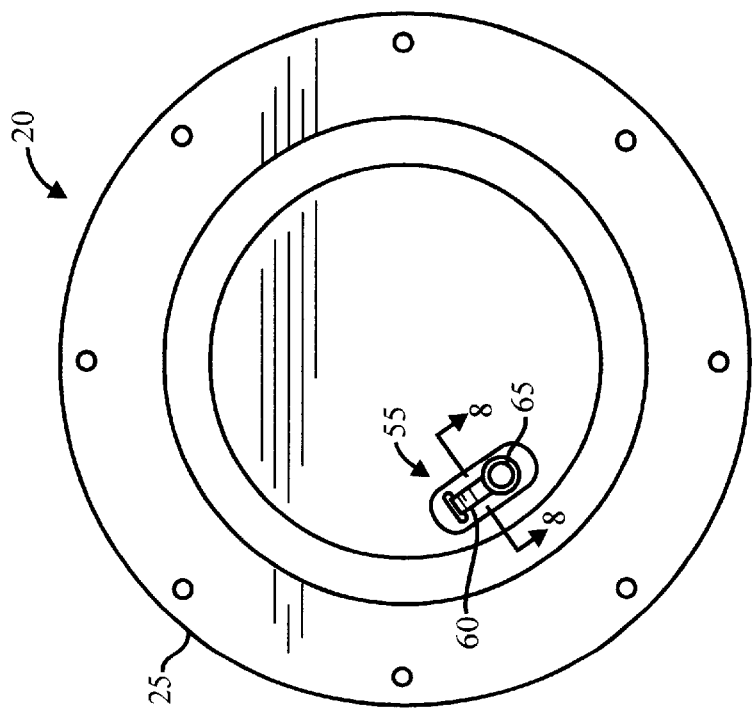
FIG. 7b is a bottom plan view of the electrostatic chuck of FIG. 6c showing an orientation for the electrical contact used for the electrical connector.

After cutting out the electrical connector 55, a portion of the residual insulator on the electrical connector 55 can be removed by peeling off the insulator layer to expose the underlying electrically conductive layer thereby forming the electrical contact 65. The insulated electrical lead 60 and electrical contact 65 are then inserted through the hole in the base 25 so that the electrical contact 65 is disposed below the base 25. When the chuck 20 of FIG. 2b is fabricated, the electrical lead 60 is folded as shown in FIG. 8, to allow the lead to extend through the hole 30 on the base 25 of the chuck 20. Folding of the electrical lead 60 is necessary so that the exposed portion of the electrical contact 65 is directed away from the base 25 and toward the voltage supply terminal 70 on the support 75.

The electrostatic member 33 is then adhered to the base 25 of the chuck 20, using conventional pressure or temperature sensitive adhesives, such as polyimides. Thereafter, the electrical contact 65 is adhered to the support member 75 on the base 25 of the chuck 20.

When a separate contact assembly 67 is used, as shown in FIG. 2b, the electrical lead 60 is cut out of the laminate as described above. A lower layer of the insulative sleeve 162 around the end of the electrical lead 60 is removed to expose the conductive core 160 and remaining insulative material of the electrical lead 60 are inserted into the slotted disk 365, and the exposed portion of the conductive core 160 and the slotted disk 365 are adhered to the conductive disk 165 with a conductive adhesive. The conductive disk 165 with the end of the electrical lead 60 and slotted disk 365 adhered thereto is laminated between the insulative disk 265 and washer 465. The laminated contact assembly 67 is then attached to the underside of the base 25 of the chuck 20.

An alternative method of fabricating the electrostatic member 33 is described below. In this method, an electrically insulative polymer film, such as the "KAPTON," "APIQUEO," "UPILEX," "NITOMID" films described above, is selected, and an electrically conductive layer is formed on the insulative film. The electrically conductive layer can be formed by electroplating, chemical vapor deposition, or physical vapor deposition methods. A preferred method of forming the conductive layer comprises a multi-step electroplating process which includes the steps of: (i) sputter depositing a "seed" chromium layer onto the insulative layer, (ii) coating the sputtered chromium layer with a resist layer, (iii) patterning the resist layer into a pattern corresponding to the desired electrode and integral electrical connector 55 configurations, and (iv) electroplating metal onto the chromium seed layer portions which are not coated by resist to form the electrodes 130, 135 and integral electrical connector 55.

In the first step of the multi-step electroplating process, a chromium layer is sputtered over the insulative film to obtain a "seed" layer for nucleating growth of the electroplated metal. The chromium layer is typically sputtered to a thickness of about 100–200 microns. Conventional chromium sputtering techniques are suitable, such as for example, those generally disclosed in J. A. Thorton, "Sputter Deposition Onto Plastics," Proceedings 18th American Conference of Society of Vacuum Coaters, Key Biscayne, Fla., Apr. 7–9 (1975), pages 8–26, which is incorporated herein by reference. Photolithographic methods, such as those previously described, are then used to apply and pattern a photoresist layer over the chromium "seed" layer in the desired configuration for the electrodes 130, 135 and electrical connector 55. The patterned resist layer prevents the deposition of electroplated metal on the resist coated portions, during the electroplating step. Thereafter, the resist coated insulative film is electroplated to form the patterned electrodes 130, 135 between the resist coated portions. Conventional copper plating techniques are suitable for forming the electrodes 130, 135 and the electrical connector 55, such as for example, those generally disclosed in U.S. Pat. No. 5,252,196 to Sonnenberg, et al.; U.S. Pat. No. 5,004,525 to Bernards, et al.; U.S. Pat. No. 4,898,647 to Luce, et al.; and U.S. Pat. No. 4,948,474 to Miljkovic—all of which are incorporated herein by reference.

After forming the electrodes 130, 135 and the electrical connector 55 on the insulative film, remnant resist and chromium are etched from the insulative film. Remnant resist is removed by wet chemical etching or plasma etching methods. A suitable wet chemical etching method comprises immersing the insulative film into a solution of N-methylpyrolidone heated to 80° C. for about ten minutes. Alternatively, plasma etching techniques, such as those utilizing an oxygen plasma, as generally disclosed in *Silicon Processing*, Chapter 15, supra, which is incorporated herein by reference, can also be used to etch the remnant resist. After removal of the resist remnant, residual chromium is removed by a wet chemical etching step, such as immersing the insulative film in a solution of sodium persulfate, followed by immersion in a solution of potassium permanganate.

A second electrically insulative film is then applied over the electrodes 130, 135 and the integral electrical connector 55 in the form of a sheet of insulative material (as described above), or by spraying, dipping, painting, spin coating, or silk screening an electrically insulative polymer over the electrodes 130, 135 and electrical connector 55. When a sheet of insulative material is adhered on the electrodes 130, 135, the grooves 105 can be formed by etching a groove pattern into the upper insulative layer 35b. Alternatively, when a liquid polymer is used, the viscous liquid polymer flows into the voids 52 between the electrodes 130, 135 or the trenches in the patterned electrode 50, forming the grooves 105 on the upper surface 40 of the insulator 35.

Instead of electroplating, the electrodes 130, 135 and integral electrical connector 55 can also be formed on the insulative film by the steps of: (i) depositing a continuous metal layer on the insulative layer by conventional chemical or physical vapor deposition techniques, such as sputtering, (ii) forming a patterned resist layer on the metal layer, using the conventional techniques described above, and (iii) etching the portions of the metal layer that are exposed between resist coated portions, by a wet chemical or plasma activated etching process, as described above. A preferred method of fabricating the electrodes 130, 135 using a sputtering technique to form a substantially thin electrode is disclosed in aforementioned U.S. Patent Application entitled, "Electrostatic Chuck Having Improved Erosion Resistance."

Method of Manufacturing Masking Gas Assembly

When a masking gas assembly 115 is included with the chuck 20, the masking gas assembly 115 is provided integral with the base 25, as shown in FIGS. 9 and 10. The base 25 is machined to have a central raised pedestal portion 155 and an extending collar ledge 145, the pedestal portion 155 having a circumferential perimeter wall 150, and the collar ledge 145 extending outward from the wall 150 at a reduced height from the pedestal portion 155. The plurality of gas injection holes 195 are bored into the base 25 on the collar ledge 145, and the base 25 is provided with an annular gas channel 260 which extends circumferentially within the base 25 below the gas injection holes 195. The gas channel 260 is preferably formed by cutting a circumferential groove 262 underneath the base 25, and welding, press fitting or otherwise attaching a cover 270 in a base of the groove 262. Each of the plurality of gas injection holes 195 extend from an inner terminus of the groove 262, upwardly through the collar ledge 145 adjacent to the wall, to supply the masking gas to the perimeter 110 of the insulator 35.

Preferably, each of the gas injection holes 195 includes a precision bore portion 275 which extends through the collar ledge 145, and an enlarged counterbore 280 which extends from the gas channel 260 to the precision bore portion 275 to ensure a continuous source of masking gas into the precision bore portion 275. To provide the masking gas to the gas channel 260, a cross-bore 285 is preferably formed, extending from a wall of the base 25, through the gas channel 260, to an interior position within the base 25. A supply bore 290 is formed in the base 25 at the interior position of the cross-bore 285, and a masking gas feed line 295 extends from the supply bore 290, in a downward direction, through the base 25 and the electrically conductive support member 75. The masking gas feed line 295 terminates in a masking gas supply below the electrically conductive support member 75. The cross-bore 285 is fitted with a plug 300 at the wall of the base 25.

In an alternative method of fabricating the masking gas assembly 115, the assembly 115 is not integral with the base 25 and electrically conductive support member 75 of the chuck 20. The gas injection holes 195 are provided within a separate gas manifold member mounted to the process chamber walls, and positioned around the base 25.

The electrostatic chuck 20 having features of the present invention has several advantages. First, the electrical connector 55 is substantially resistant to erosion by the erosive environment in the process chamber 80 because the connector is passed through the base 25, and is thereby substantially covered and protected by the substrate 45 held on the chuck 20. In addition, the inclusion of the masking gas assembly 115 provides additional erosion resistance to the chuck 20. Furthermore, when the electrical contact 65 is an integral extension of the electrodes 130, 135, it is not necessary to assemble a high voltage contact assembly 67 comprising electrical contact disks and washers to form the electrical contact 65. Thus, the integral electrical contact 65 provides ease of fabrication of the chuck 20, and provides a less expensive and more reliable chuck 20.

Other advantages are provided by the multi-electrode versions of the chuck 20. First, positioning of the cooling grooves 105 in the electrical isolation voids 52 between the electrodes 130, 135 allows maximization of the electrostatic clamping force generated by the electrodes 130, 135 and allows placing the cooling grooves 105 at the peripheral edge 110 of the chuck 20 to effectively cool the perimeter 235 of the substrate 45 held on the chuck 20. Further, the switching system 238 allows the chuck 20 to be used in both non-plasma or plasma processes, by operating the chuck 20 in a bipolar or monopolar mode. For these reasons, the chuck 20 of the present invention is a significant improvement over prior art chucks.

Although the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. A method of fabricating an electrostatic chuck, the method comprising forming an electrostatic member by covering an electrically conductive layer with a dielectric layer, and shaping the electrostatic member to form a dielectric covered electrode and an integral dielectric covered electrical connector to conduct charge to the dielectric covered electrode, wherein the electrostatic member is shaped so that the dielectric covered electrical connector can extend through a bore in a base which can support the electrostatic member.

2. A method according to claim 1 wherein forming the electrostatic member comprises forming a laminate comprising dielectric and electrically conductive layers.

3. A method according to claim 1 comprising forming an electrical connector comprising a dielectric covered electrical lead having one end attached to the electrode and another end with an exposed electrical contact.

4. A method according to claim 3 wherein forming an electrical connector with an exposed electrical contact comprises removing a portion of the dielectric on the dielectric covered electrical lead to expose the electrical contact.

5. A method according to claim 3 wherein the exposed electrical contact comprises a surface area of at least about 50 sq. mm.

6. A method according to claim 1 wherein forming an electrical connector comprises forming the electrical connector within a groove shaped in the electrostatic member, the groove adapted to hold coolant.

7. A method according to claim 1 further comprising forming a base having a bore therethrough, placing the electrostatic member on the base, and extending the electrical connector through the bore in the base so that a portion of the electrical connector is below the base.

8. A method according to claim 1 further comprising etching, cutting, routing or milling the electrically conductive layer to form an electrode having a groove adapted to hold coolant.

9. A method according to claim 1 wherein the dielectric covering of the electrode and the dielectric covering of the connector are integral.

* * * * *